US012660605B2

(12) United States Patent
Lee et al.

(10) Patent No.: US 12,660,605 B2
(45) Date of Patent: Jun. 16, 2026

(54) SEMICONDUCTOR DEVICE INCLUDING DATA STORAGE LAYER

(71) Applicant: SAMSUNG ELECTRONICS CO., LTD., Suwon-si (KR)

(72) Inventors: Jeonil Lee, Suwon-si (KR); Seryeun Yang, Suwon-si (KR); Hyeran Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 443 days.

(21) Appl. No.: 18/195,646

(22) Filed: May 10, 2023

(65) Prior Publication Data

US 2023/0369214 A1 Nov. 16, 2023

(30) Foreign Application Priority Data

May 11, 2022 (KR) ........................ 10-2022-0057686

(51) Int. Cl.
*H10W 20/41* (2026.01)
*H10B 51/10* (2023.01)
(Continued)

(52) U.S. Cl.
CPC .......... *H10W 20/435* (2026.01); *H10B 51/10* (2023.02); *H10B 51/30* (2023.02);
(Continued)

(58) Field of Classification Search
CPC ...... H10D 30/63; H10D 30/701; H10D 62/40; H10D 64/252; H10D 64/258; H10D 64/665
See application file for complete search history.

(56) References Cited

U.S. PATENT DOCUMENTS 9,685,215 B1 6/2017 Kang et al.
11,062,965 B2 * 7/2021 Cheng .................. H10D 84/853
(Continued)

FOREIGN PATENT DOCUMENTS

CN 105453267 A * 3/2016 ....... H01L 21/02568
CN 104126227 B * 9/2016 ........... H10D 30/477
(Continued)

OTHER PUBLICATIONS

Communication issued Mar. 23, 2026 by the Korean Ministry of Intellectual Property in Korean Patent Application No. 10-2022-0057686.

*Primary Examiner* — Matthew E Warren
(74) *Attorney, Agent, or Firm* — Sughrue Mion, PLLC

(57) ABSTRACT

A semiconductor device is provided. The semiconductor device includes: first lower conductive lines extending in a first direction and disposed at a first height level; first upper conductive lines extending in the first direction and vertically overlapping the first lower conductive lines at a second height level, higher than the first height level; single crystal semiconductor patterns disposed between the first lower conductive lines and the first upper conductive lines at a third height level; intermediate conductive lines extending in a second direction intersecting the first direction and passing between the single crystal semiconductor patterns, between the first height level and the second height level; and data storage layers including portions between the intermediate conductive lines and the single crystal semiconductor patterns.

13 Claims, 28 Drawing Sheets

(51) Int. Cl.

| | |
|---|---|
| *H10B 51/30* | (2023.01) |
| *H10B 51/40* | (2023.01) |
| *H10D 30/63* | (2025.01) |
| *H10D 30/69* | (2025.01) |
| *H10D 62/40* | (2025.01) |
| *H10D 64/23* | (2025.01) |
| *H10D 64/66* | (2025.01) |

(52) U.S. Cl.

CPC ............. *H10B 51/40* (2023.02); *H10D 30/63* (2025.01); *H10D 30/701* (2025.01); *H10D 62/40* (2025.01); *H10D 64/252* (2025.01); *H10D 64/258* (2025.01); *H10D 64/665* (2025.01)

(56) References Cited

U.S. PATENT DOCUMENTS

| | | | |
|---|---|---|---|
| 11,152,509 B2 | 10/2021 | Sills et al. | |
| 11,164,889 B2 | 11/2021 | Karda et al. | |
| 2006/0006444 A1 | 1/2006 | Leslie | |
| 2018/0358475 A1 | 12/2018 | Guo et al. | |
| 2019/0348424 A1* | 11/2019 | Karda .................... | H10B 51/20 |
| 2020/0227429 A1* | 7/2020 | Ji ...................... | H01L 21/02554 |
| 2023/0027308 A1* | 1/2023 | Ramaswamy ......... | H10B 53/40 |

FOREIGN PATENT DOCUMENTS

| | | | | |
|---|---|---|---|---|
| CN | 113451320 A | * | 9/2021 | ........... H10D 64/031 |
| KR | 10-2010-0127668 A | | 12/2010 | |
| KR | 10-2019-0029942 A | | 3/2019 | |
| WO | WO-2022153676 A1 | * | 7/2022 | ........... H10D 84/837 |

* cited by examiner

1a

SEMICONDUCTOR DEVICE INCLUDING DATA STORAGE LAYER

CROSS-REFERENCE TO RELATED APPLICATION

This application claims priority to Korean Patent Application No. 10-2022-0057686 filed on May 11, 2022 in the Korean Intellectual Property Office, the disclosure of which is incorporated by reference herein in its entirety.

BACKGROUND

The present disclosure relates to a semiconductor device including a data storage layer and a method of manufacturing the semiconductor device.

Recently, research into a memory capable of replacing a dynamic random access memory (DRAM) memory and a flash memory has been conducted. For example, research into ferroelectric memory as non-volatile, high-speed random access memory (RAM) has been conducted.

SUMMARY

One or more example embodiments provide a semiconductor device having a high degree of integration.

One or more example embodiments provide a semiconductor device with improved performance.

According to example embodiments, a semiconductor device includes: first lower conductive lines extending in a first direction and disposed at a first height level; first upper conductive lines extending in the first direction and vertically overlapping the first lower conductive lines at a second height level, higher than the first height level; single crystal semiconductor patterns disposed between the first lower conductive lines and the first upper conductive lines; intermediate conductive lines extending in a second direction intersecting the first direction and passing between the single crystal semiconductor patterns, between the first height level and the second height level; and data storage layers including portions between the intermediate conductive lines and the single crystal semiconductor patterns.

According to example embodiments, a semiconductor device includes: a lower conductive line; an upper conductive line on the lower conductive line; single crystal semiconductor patterns disposed between the lower conductive line and the upper conductive line, the single crystal semiconductor patterns including a first single crystal semiconductor pattern and a second single crystal semiconductor pattern; a data storage layer including a first vertical portion facing the first single crystal semiconductor pattern, a second vertical portion facing the second single crystal semiconductor pattern, and a horizontal portion extending between upper regions of the first and second vertical portions to connect the first and second vertical portions to each other; and a first intermediate conductive line and a second intermediate conductive line disposed between the first vertical portion and the second vertical portion and spaced apart from each other, and between the first and second single crystal semiconductor patterns.

According to example embodiments, a semiconductor device includes: lower conductive lines extending in a first direction and disposed at a first height level; upper conductive lines extending in the first direction and vertically overlapping the lower conductive lines at a second height level, higher than the first height level; semiconductor patterns disposed between the first height level and the second height level; intermediate conductive lines extending in a second direction intersecting the first direction and passing between the semiconductor patterns, between the first height level and the second height level; and data storage layers including portions between the intermediate conductive lines and the semiconductor patterns. The lower conductive lines include first lower conductive lines and second lower conductive lines alternately and repeatedly arranged in the second direction. The upper conductive lines include first upper conductive lines and second upper conductive lines alternately and repeatedly arranged in the second direction. The first lower conductive lines and the first upper conductive lines vertically overlap the semiconductor patterns. The second lower conductive lines and the second upper conductive lines do not vertically overlap the semiconductor patterns.

BRIEF DESCRIPTION OF DRAWINGS

The above and other aspects and features will be more apparent from the following description of example embodiments, taken in conjunction with the accompanying drawings, in which.

DETAILED DESCRIPTION

Example embodiments will now be described more fully with reference to the accompanying drawings. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on,"

"connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Terms such as "upper portion," "middle portion," and "lower portion" may be replaced with other terms, for example, "first," "second," and "third" to describe elements of the specification. Terms such as "first," "second," and "third" may be used to describe different elements, but the elements are not limited by the terms, and a "first element" may be referred to as a "second element."

Figure 1:
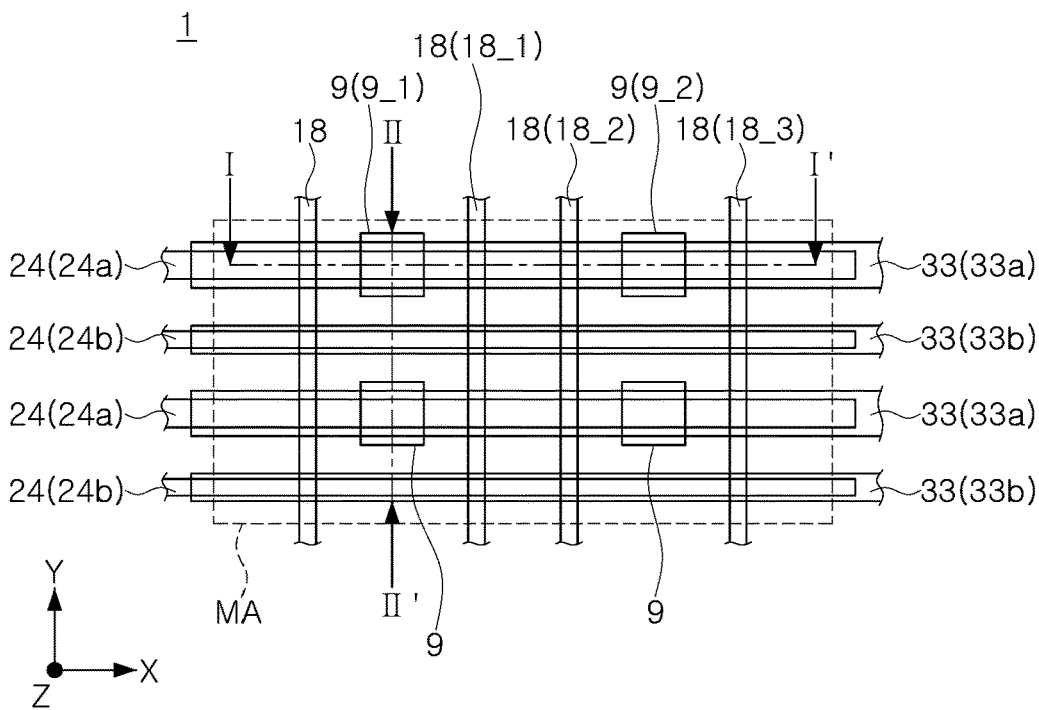
FIGS. 1 and 2 are schematic views illustrating a semiconductor device according to an example embodiment.
Figure 2:
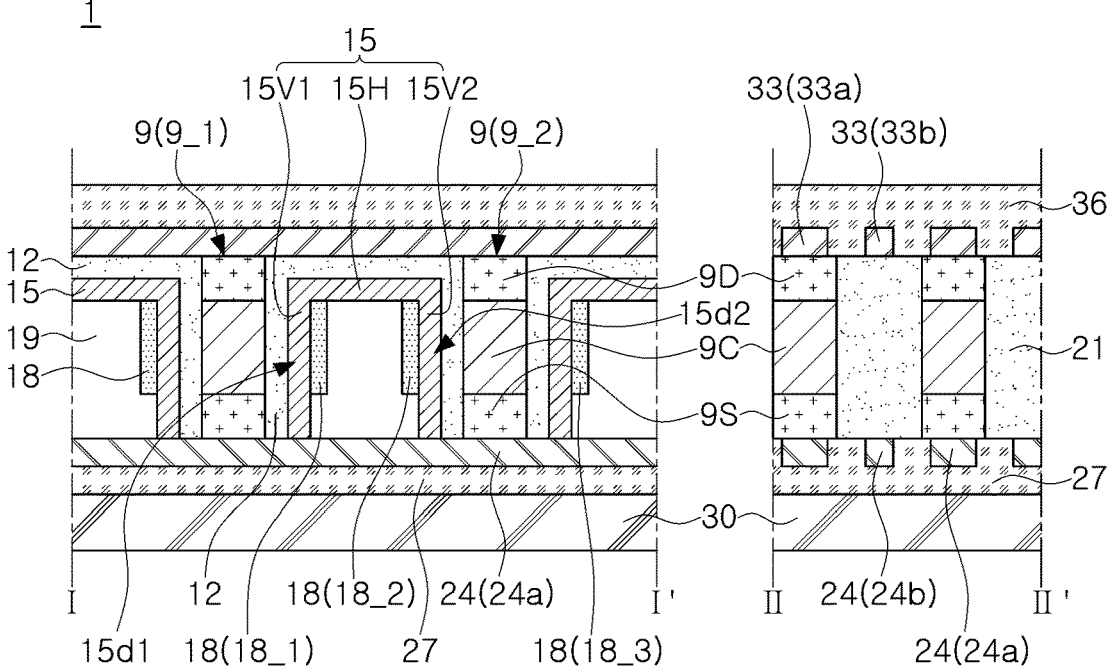

A semiconductor device according to an example embodiment will be described with reference to FIGS. 1 and 2. FIG. 1 is a schematic top view illustrating a semiconductor device according to an example embodiment. FIG. 2 is a schematic cross-sectional view illustrating regions taken along lines I-I' and II-IF in FIG. 1.

Referring to FIGS. 1 and 2, a semiconductor device 1 according to an example embodiment may include lower conductive lines 24 disposed at a first height level, upper conductive lines 33 disposed at a second height level higher than the first height level, semiconductor patterns 9 disposed at a third height level between the first height level and the second height level, intermediate conductive lines 18 extending in a direction intersecting the upper conductive lines and passing between the semiconductor patterns, between the first height level and the second height level, and data storage layers 15 including regions interposed between the intermediate conductive lines 18 and the semiconductor patterns 9.

Each of the lower conductive lines 24 may extend in a first direction X. The lower conductive lines 24 may be parallel to each other. The lower conductive lines 24 may include first lower conductive lines 24a and second lower conductive lines 24b alternately and repeatedly arranged in a second direction Y, perpendicular to the first direction X. A width of each of the first lower conductive lines 24a may be greater than a width of each of the second lower conductive lines 24b.

Each of the lower conductive lines 24 may include doped polysilicon, a metal, a conductive metal nitride, a metal-semiconductor compound, a conductive metal oxide, a conductive graphene, carbon nanotubes, or a combination thereof. For example, each of the lower conductive lines 24 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or a combination thereof, but is not limited thereto. Each of the lower conductive lines 24 may include a single layer or multiple layers of the materials described above.

Each of the upper conductive lines 33 may extend in the first direction X. The upper conductive lines 33 may be parallel to each other. The upper conductive lines 33 may include first upper conductive lines 33a and second upper conductive lines 33b alternately and repeatedly arranged in the second direction Y. A width of each of the first upper conductive lines 33a may be greater than a width of each of the second upper conductive lines 33b.

Each of the upper conductive lines 33 may include doped polysilicon, a metal, a conductive metal nitride, a metal-semiconductor compound, a conductive metal oxide, a conductive graphene, carbon nanotubes, or a combination thereof. For example, each of the upper conductive lines 33 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or a combination thereof, but is not limited thereto. Each of the upper conductive lines 33 may include a single layer or multiple layers of the materials described above.

The semiconductor patterns 9 may be arranged in the first direction X and the second direction Y. The semiconductor patterns 9 may be disposed in a memory region MA of the semiconductor device 1. The memory region MA may be a memory cell array region in which memory cells are disposed.

The semiconductor patterns 9 may be disposed between the first lower conductive lines 24a and the first upper conductive lines 33a. The semiconductor patterns 9 may vertically overlap the first lower conductive lines 24a and the first upper conductive lines 33a. The semiconductor patterns 9 may not vertically overlap the second lower conductive lines 24b and the second upper conductive lines 33b.

Each of the semiconductor patterns 9 may include a first source/drain region 9S, a second source/drain region 9D, and a channel region 9C between the first and second source/drain regions 9S and 9D. The channel region 9C may be a vertical channel region.

In an example embodiment, the first and second source/drain regions 9S and 9D may have a first conductivity-type, and the channel region 9C may have a second conductivity-type different from the first conductivity-type. For example, the first conductivity-type may be N-type conductivity, and the second conductivity-type may be P-type conductivity. In another example, the channel region 9C may be an intrinsic semiconductor region or undoped semiconductor region.

The lower source/drain regions 9S of the semiconductor patterns 9 may be electrically connected to the first lower conductive lines 24a, and the upper source/drain regions 9D of the semiconductor patterns 9 may be electrically connected to the first upper conductive lines 33a.

The second lower conductive lines 24b may be electrically isolated from the semiconductor patterns 9. Here, "being electrically isolated from the semiconductor patterns 9" may indicate that the second lower conductive lines 24b are not electrically connected to the semiconductor patterns 9. The second upper conductive lines 33b may be electrically isolated from the semiconductor patterns 9.

The second lower conductive lines 24b may screen capacitive coupling between the first lower conductive lines 24a adjacent to each other. For example, the second lower conductive lines 24b may reduce or block parasitic capacitance between the first lower conductive lines 24a adjacent to each other, thereby minimizing a Resistance-Capacitance (RC) delay in the first lower conductive lines 24a. The second lower conductive lines 24b may be referred to as lower shielding lines.

The second upper conductive lines 33b may screen capacitive coupling between the first upper conductive lines 33a adjacent to each other. For example, the second upper conductive lines 33b may reduce or block parasitic capacitance between the first upper conductive lines 33a adjacent to each other, thereby minimizing an RC delay in the first upper conductive lines 33*a*. The second upper conductive lines 33*b* may be referred to as upper shielding lines.

The semiconductor patterns 9 may be formed of a single crystal semiconductor material. For example, the semiconductor patterns 9 may include a group IV semiconductor, a group III-V compound semiconductor, or a group II-VI compound semiconductor. The plurality of semiconductor patterns 9 may be a single crystal semiconductor including at least one of silicon, silicon carbide, germanium, or silicon-germanium. For example, the semiconductor patterns 9 may be single crystal silicon patterns or single crystal silicon carbide patterns. The semiconductor patterns 9 may be referred to as "single crystal semiconductor patterns."

The semiconductor patterns 9 may include a first semiconductor pattern 9_1 and a second semiconductor pattern 9_2 adjacent to each other in the first direction X.

Each of the intermediate conductive lines 18 may extend in the second direction Y. The intermediate conductive lines 18 may include a first intermediate conductive line 18_1 and a second intermediate conductive line 18_2 passing between the first and second semiconductor patterns 9_1 and 9_2. The first intermediate conductive line 18_1 and the second intermediate conductive line 18_2 may be parallel to each other. The intermediate conductive lines 18 may further include a third intermediate conductive line 18_3. The first intermediate conductive line 18_1, the second intermediate conductive line 18_2, and the third intermediate conductive line 18_3 may be sequentially arranged in the first direction X. The second semiconductor pattern 9_2 may be disposed between the second intermediate conductive line 18_2 and the third intermediate conductive line 18_3.

The intermediate conductive lines 18 may include gate lines and intermediate shielding lines. In the intermediate conductive lines 18, the gate lines and the intermediate shielding lines may be alternately and repeatedly arranged in the first direction X. For example, the first intermediate conductive line 18_1 and the third intermediate conductive line 18_3 may be a gate line, and the second intermediate conductive line 18_2 may be an intermediate shielding line.

The intermediate shielding lines may screen capacitive coupling between the gate lines adjacent to each other.

Among the intermediate shielding lines, an intermediate shielding line positioned between the gate line and the semiconductor pattern may prevent the semiconductor pattern from being affected by the gate line. For example, the second intermediate conductive line 18_2, which may be the intermediate shielding line, may prevent or minimize a reduction in electrical properties or performance of the semiconductor device 1 due to the second semiconductor pattern 9_2 that is affected by an electric field generated by the first intermediate conductive line 18_1, which may be the gate line.

Each of the intermediate conductive lines 18 may include doped polysilicon, a metal, a conductive metal nitride, a metal-semiconductor compound, a conductive metal oxide, a conductive graphene, carbon nanotubes, or a combination thereof. For example, each of the intermediate conductive lines 18 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof, but is not limited thereto. Each of the intermediate conductive lines 18 may include a single layer or multiple layers of the materials described above.

In example embodiments, the first lower conductive lines 24*a* may be referred to as source lines, and the first upper conductive lines 33*a* may be referred to as bit lines.

In example embodiments, the first intermediate conductive lines 18_1, which may be gate lines, among the intermediate conductive lines 18 may be referred to as word lines.

Each of the data storage layers 15 may include a ferroelectric layer capable of storing data. Each of the data storage layers 15 may be a single layer or multiple layers.

The ferroelectric layer of the data storage layers 15 may have polarization properties which vary according to an electric field applied by intermediate conductive lines, which may be word lines, among the intermediate conductive lines 18, and may have a remnant polarization caused by a dipole even in the absence of an external electric field. Data may be recorded using a polarization state in the ferroelectric layer of the data storage layers 15 described above.

Each of the data storage layers 15 may include a ferroelectric layer and an anti-ferroelectric layer. For example, in each of the data storage layers 15, the ferroelectric layer and the anti-ferroelectric layer may be formed of multiple layers.

The ferroelectric layer of the data storage layers 15 may include an Hf-based compound, a Zr-based compound, and/or an Hf—Zr-based compound. For example, the Hf-based compound may include an HfO-based ferroelectric material, the Zr-based compound may include a ZrO-based ferroelectric material, and the Hf—Zr-based compound may include a hafnium zirconium oxide (HZO)-based ferroelectric material.

The ferroelectric layer of the data storage layers 15 may include a ferroelectric material doped with an impurity, for example, at least one of C, Si, Mg, Al, Y, N, Ge, Sn, Gd, La, Sc, and Sr. For example, the ferroelectric layer of the data storage layers 15 may be a material in which at least one of HfO$_2$, ZrO$_2$, and HZO is doped with at least one of impurities such as C, Si, Mg, Al, Y, N, Ge, Sn, Gd, La, Sc, and Sr.

The ferroelectric layer of the data storage layers 15 is not limited to the above-described material types, and may include a material having ferroelectric properties capable of storing data. For example, the ferroelectric layer of the data storage layers 15 may include at least one of BaTiO$_3$, PbTiO$_3$, BiFeO$_3$, SrTiO$_3$, PbMgNdO$_3$, PbMgNbTiO$_3$, PbZrNbTiO$_3$, PbZrTiO$_3$, KNbO$_3$, LiNbO$_3$, GeTe, LiTaO$_3$, KNaNbO$_3$, BaSrTiO$_3$, HF$_{0.5}$Zr$_{0.5}$O$_2$, PbZr$_x$Ti$_{1-x}$O$_3$ (0<x<1), Ba(Sr,Ti)O$_3$, Bi$_{4-x}$La$_x$Ti$_3$O$_{12}$ (0<x<1), SrBi$_2$Ta$_2$O$_9$, PB$_5$Ge$_5$O$_{11}$, SrBi$_2$Nb$_2$O$_9$, and YMnO$_3$.

Each of the data storage layers 15 may include a first vertical portion 15V1, a second vertical portion 15V2, and a horizontal portion 15H extending from an upper region of the first vertical portion 15V1 and an upper region of the second vertical portion 15V2 to connect the upper regions of the first and second vertical portions 15V1 and 15V2 to each other.

The data storage layers 15 may include a first data storage layer. The first and second intermediate conductive lines 18_1 and 18_2 may pass between the first and second vertical portions 15V1 and 15V2 of the first data storage layer 15, and may vertically overlap the horizontal portion 15H. The horizontal portion 15H of the first data storage layer 15 may be disposed on the first and second intermediate conductive lines 18_1 and 18_2. In the data storage layers 15, the first and second vertical portions 15V1 and 15V2 may include regions 15*d*1 and 15*d*2 facing at least the channel regions 9C.

Lower surfaces of the data storage layers 15 may be coplanar with lower surfaces of the semiconductor patterns 9. Upper surfaces of the data storage layers 15 may be disposed at a level lower than those of upper surfaces of the semiconductor patterns 9. Lower ends of the intermediate conductive lines 18 may be disposed at a level higher than those of the lower surfaces of the data storage layers 15 and the lower surfaces of the semiconductor patterns 9. Upper ends of the intermediate conductive lines 18 may be disposed at a level lower than those of the upper surfaces of the data storage layers 15 and the upper surfaces of the semiconductor patterns 9. The intermediate conductive lines 18 may face at least the channel regions 9C.

The semiconductor device 1 may further include insulating layers 12 including first portions disposed between the first vertical portions 15V1 of the data storage layers 15 and the semiconductor patterns 9, and second portions disposed between the second vertical portions 15V2 of the data storage layers 15 and the semiconductor patterns 9. The insulating layers 12 may further include third portions covering the horizontal portions 15H of the data storage layers 15.

The insulating layers 12 may be referred to as a buffer insulating layer or a gate insulating layer. The insulating layers 12 may be tunnel barrier layers capable of preventing charges in the semiconductor patterns 9 from being trapped into the data storage layers 15 to prevent a reduction in performance of the semiconductor device 1.

The insulating layers 12 may include at least one of silicon oxide and a high-κ dielectric. The high-κ dielectric may include a metal oxide or a metal oxynitride. For example, the high-κ dielectric may be formed of $HfO_2$, HfSiO, HfSiON, HfTaO, HfTiO, HfZrO, $ZrO_2$, $Al_2O_3$, or a combination thereof, but is not limited thereto. The insulating layers 12 may be formed of a single layer or multiple layers of the materials described above.

The semiconductor device 1 may further include a base 30 disposed below the lower conductive lines 24, and a lower capping layer 27 between the base 30 and the lower conductive lines 24. The base 30 may be omitted. The base 30 may be formed of a semiconductor layer, but example embodiments are not limited thereto, and the base 30 may be formed of other materials. The lower capping layer 27 may be formed of an insulating material such as silicon oxide and/or silicon nitride.

The semiconductor device 1 may further include an upper capping layer 36 covering the upper conductive lines 33. The upper capping layer 36 may be formed of an insulating material such as silicon oxide and/or silicon nitride.

The semiconductor device 1 may further include first intermediate insulating layers 19 disposed between the first and second vertical portions 15V1 and 15V2, and second intermediate insulating layers 21 disposed between the semiconductor patterns 9 arranged in the second direction Y. The intermediate conductive lines 18 may be disposed between the first intermediate insulating layers 19 and the data storage layers 15.

The first and second intermediate insulating layers 19 and 21 may be formed of an insulating material such as silicon oxide, silicon oxynitride, or silicon nitride. In an example, the first and second intermediate insulating layers 19 and 21 may be formed of the same material. In another example, the first and second intermediate insulating layers 19 and 21 may be formed of different materials.

According to an example embodiment, the data storage layer 15 including the first vertical portion 15V1 disposed between the first intermediate conductive line 18_1, which may be a gate line, and the channel region 9C, which may be a vertical channel, may be disposed without a capacitor for storing data, thereby providing the semiconductor device 1 having a high degree of integration.

According to an example embodiment, the channel region 9C may be formed of a single crystal semiconductor, thereby providing the semiconductor device 1 having improved charge mobility and on-current properties. For example, the single crystal semiconductor may allow for a larger current to flow through the channel region 9C.

According to an example embodiment, shielding lines capable of screening capacitive coupling may be disposed between conductive lines, thereby providing the semiconductor device 1 having improved electrical performance. The shielding lines may be the lower shielding lines 24b, the upper shielding lines 33b, and the intermediate shielding line 18_2.

According to an example embodiment, the data storage layers 15 may include a ferroelectric layer capable of storing data, thereby providing the semiconductor device 1 of a ferroelectric memory (FeRAM) having a high degree of integration and improved electrical performance.

Hereinafter, additional example embodiments will be described. The example embodiments to be described below will be mainly described with respect to elements to be modified or elements to be replaced when compared with the above-described example embodiments. In addition, example embodiments discussed below are not excluded from being associated with one or more features of another example or another embodiment also provided herein or not provided herein but consistent with the present disclosure.

Figure 3:
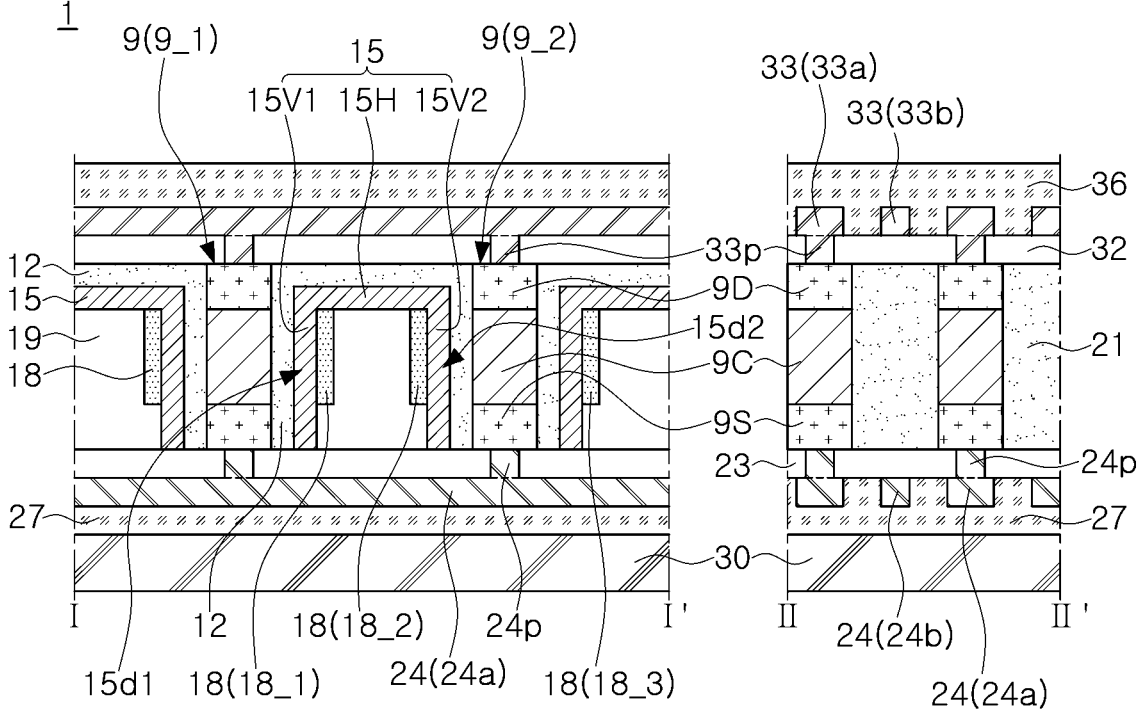
FIG. 3 is a schematic cross-sectional view illustrating a modification of a semiconductor device according to an example embodiment.

FIG. 3, a schematic cross-sectional view illustrating a modification of a semiconductor device according to an example embodiment, schematically illustrates regions taken along lines I-I' and II-II' in FIG. 1.

Referring to FIG. 3, the semiconductor device 1 described with reference to FIG. 2 may further include a lower interlayer insulating layer 23 and an upper interlayer insulating layer 32.

The lower interlayer insulating layer 23 may be disposed on the lower conductive lines 24 and the lower capping layer 27, and may be disposed below the semiconductor patterns 9, the first and second intermediate insulating layers 19 and 21, and the data storage layers 15.

The upper interlayer insulating layer 32 may be disposed below the upper conductive lines 33 and the upper capping layer 36, and may be disposed on the semiconductor patterns 9, the first and second intermediate insulating layers 19 and 21, the insulating layers 12, and the data storage layers 15.

The semiconductor device 1 may further include lower contact plugs 24p passing through the lower interlayer insulating layer 23 between the first lower conductive lines 24a and the lower source/drain regions 9S, and electrically connecting the first lower conductive lines 24a and the lower source/drain region 9S to each other, and upper contact plugs 33p passing through the upper interlayer insulating layer 32 between the first upper conductive lines 33a and the upper source/drain regions 9D, and electrically connecting the first upper conductive lines 33a and the upper source/drain regions 9D to each other.

Figure 4:
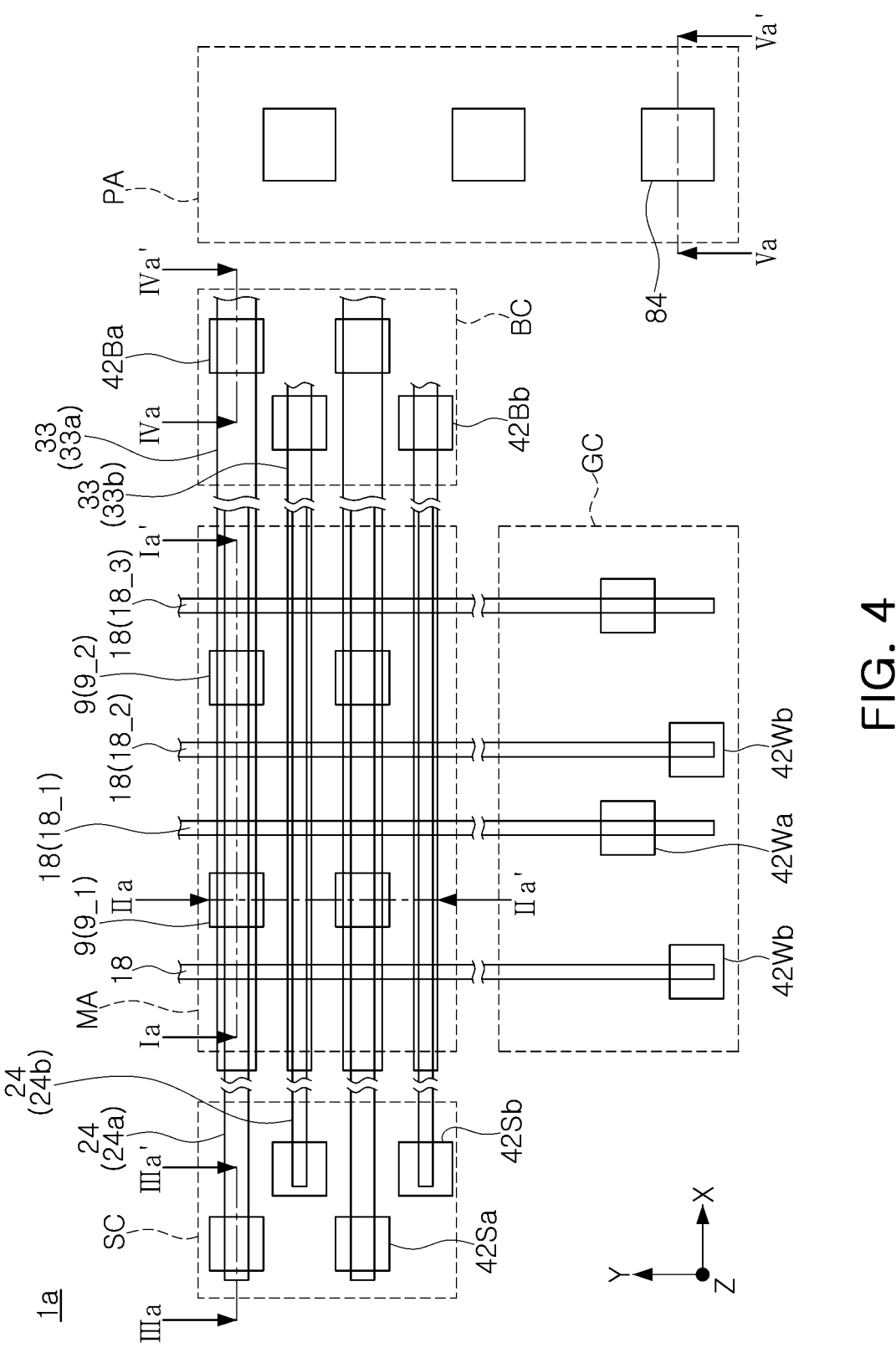
FIGS. 4, 5A, 5B, and 5C are schematic views illustrating a semiconductor device according to an example embodiment.
Figure 5A:
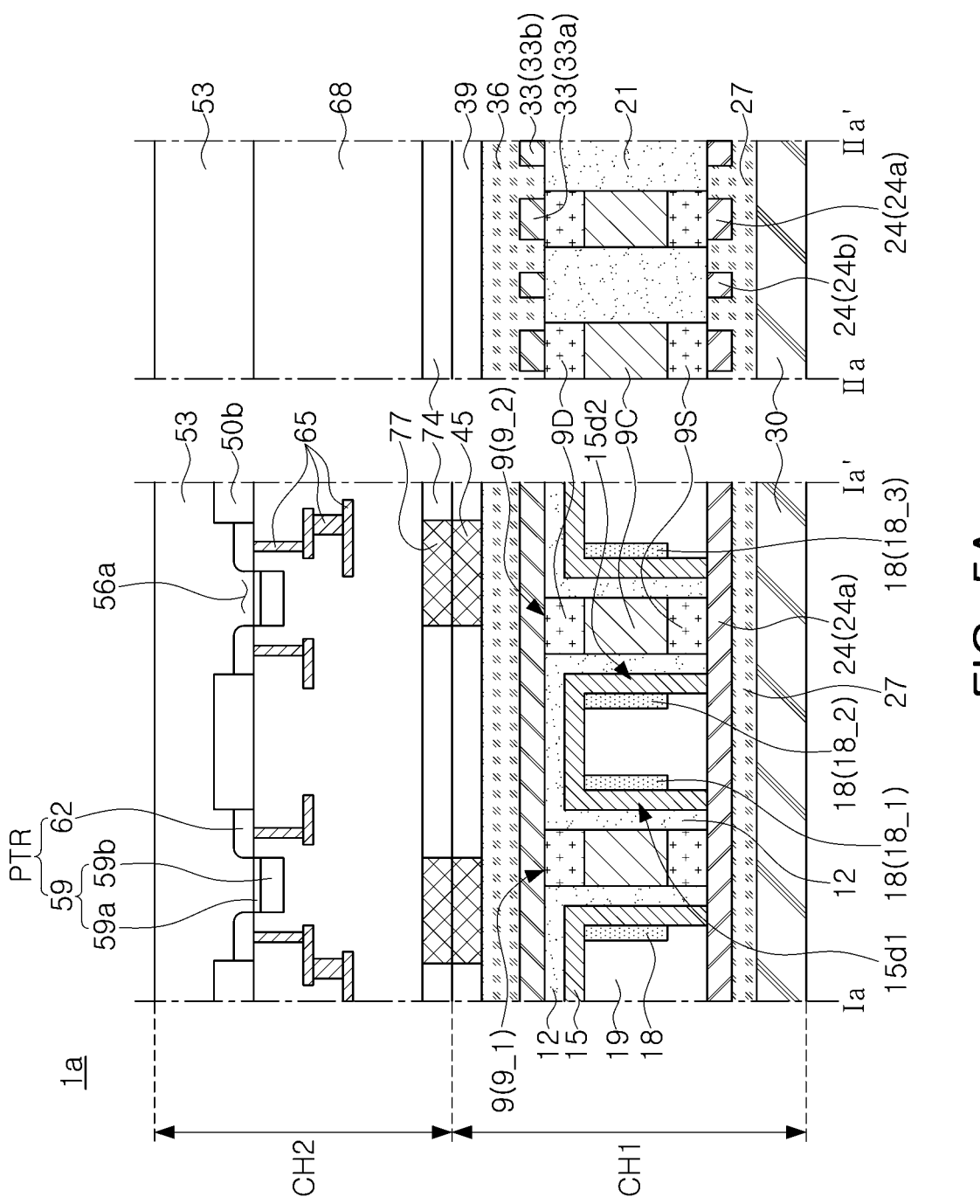
Figure 5B:
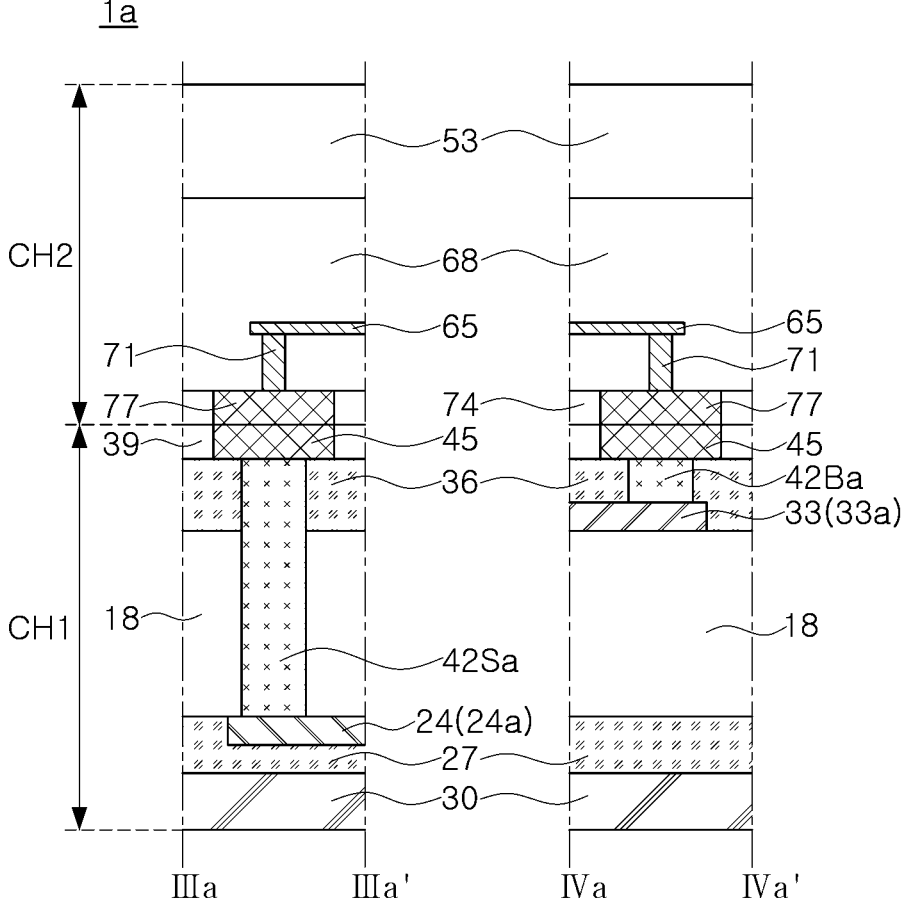
Figure 5C:
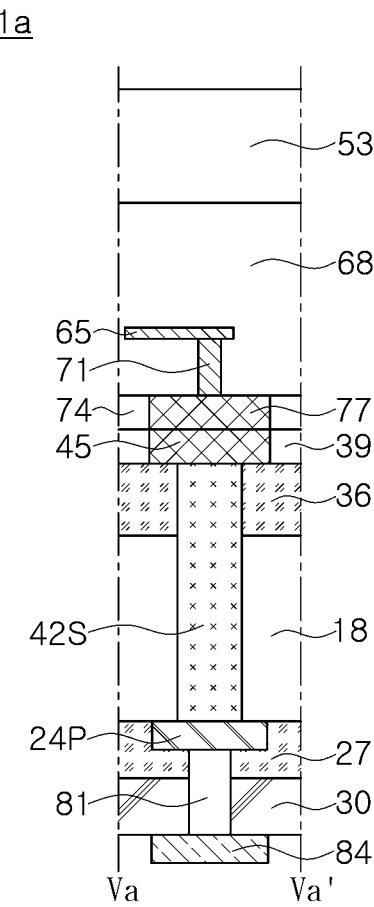

FIGS. 4, 5A, 5B, and 5C are schematic views illustrating a modification of a semiconductor device according to an example embodiment. FIG. 4 is a schematic view illustrating a modification of a semiconductor device according to an example embodiment. FIG. 5A is a schematic cross-sectional view illustrating regions taken along lines Ia-Ia' and IIa-IIa' in FIG. 4. FIG. 5B is a schematic cross-sectional view illustrating regions taken along lines IIIc-IIIc' and IVa-IVa' in FIG. 4. FIG. 5C is a schematic cross-sectional view illustrating a region taken along a line Va-Va' in FIG. 4.

Referring to FIGS. 4, 5A, 5B, and 5C, a semiconductor device 1a may further include a first contact region SC and a second contact region BC disposed on opposite sides of a memory region MA described with reference to FIGS. 1 and 2. The first contact region SC, the memory region MA, and the second contact region BC may be sequentially arranged in the first direction X. Accordingly, the memory region MA may be disposed between the first and second contact regions SC and BC. The semiconductor device 1a may further include a third contact region GC sequentially arranged with the memory region MA in the second direction Y.

In the semiconductor device 1a, the lower conductive lines 24 may extend from the memory region MA into the first contact region SC, the upper conductive lines 33 may extend from the memory region MA into the second contact region BC, and the intermediate conductive lines 18 may extend from the memory region MA into the third contact region GC.

The semiconductor device 1a may further include first lower contact plugs 42Sa electrically connected to the first lower conductive lines 24a and second lower contact plugs 42Sb electrically connected to the second lower conductive lines 24b in the first contact region SC.

The semiconductor device 1a may further include first upper contact plugs 42Ba electrically connected to the first upper conductive lines 33a and second upper contact plugs 42Bb electrically connected to the second upper conductive lines 33b in the second contact region BC.

The semiconductor device 1a may further include first intermediate contact plugs 42Wa electrically connected to the first intermediate conductive lines 18_1 and second intermediate contact plugs 42Wb electrically connected to the second intermediate conductive lines 18_2 in the third contact region GC.

The semiconductor device 1a may further include a lower bonding insulating layer 39 on the upper capping layer 36, and lower bonding pads 45 embedded in the lower bonding insulating layer 39, the lower bonding pads 45 respectively having an upper surface coplanar with an upper surface of the lower bonding insulating layer 39. The lower bonding pads 45 may include a conductive material, for example, copper (Cu).

The first and second lower contact plugs 42Sa and 42Sb, the first and second upper contact plugs 42Ba and 42Bb, and the first and second intermediate contact plugs 42Wa and 42Wb may be electrically connected to the lower bonding pads 45.

In the semiconductor device 1a, a structure from a lower surface of the base 30 to the upper surfaces of the lower bonding insulating layer 39 and the lower bonding pads 45 may be referred to as a lower chip structure CH1.

The semiconductor device 1a may further include an upper chip structure CH2. The upper chip structure CH2 may be on, in contact with and bonded to the lower chip structure CH1.

The upper chip structure CH2 may include an upper substrate 53, a peripheral circuit structure PTR and 65 disposed below the upper substrate 53, a peripheral insulating structure 68 covering the peripheral circuit structure PTR and 65 below the upper substrate 53, an upper bonding insulating layer 74 disposed below the peripheral insulating structure 68, the upper bonding insulating layer 74 in contact with the lower bonding insulating layer 39, and upper bonding pads 77 respectively having a lower surface coplanar with a lower surface of the upper bonding insulating layer 74. The upper bonding pads 77 may be in contact with and bonded to the lower bonding pads 45. The upper bonding pads 77 may include a conductive material, for example, copper (Cu). The lower bonding insulating layer 39 and the upper bonding insulating layer 74 may include at least one of SiO, SiN, SiCN, SiOC, SiON, and SiOCN.

Bonding between the lower bonding pads 45 and the upper bonding pads 77 may be, for example, metal-metal bonding such as copper (Cu)-copper (Cu) bonding, and bonding between the lower bonding insulating layer 39 and the upper bonding insulating layer 74 may be dielectric-dielectric bonding such as SiCN—SiCN bonding.

The upper substrate 53 may be a semiconductor substrate. The peripheral circuit structure PTR and 65 may include peripheral devices PTR and a circuit interconnection structure 65 electrically connected to the peripheral devices PTR.

The upper chip structure CH2 may further include vias 71 electrically connecting the circuit interconnection structure 65 and the upper bonding pads 77 to each other.

The peripheral devices PTR may include a peripheral transistor (62, 59). The peripheral transistor (62, 59) may include peripheral source/drain regions 62 disposed in an upper active region 56a defined by an upper device isolation layer 50b below the upper substrate 53, and a peripheral transistor including a peripheral gate 59 disposed below the upper active region 56a between the peripheral source/drain regions 62. The peripheral gate 59 may include a peripheral gate insulating layer 59a and a peripheral gate electrode 59b.

The semiconductor device 1a may further include an input/output pad region PA. The semiconductor device 1a may further include an input/output pad 84 disposed below the base 30 in the input/output pad region PA.

In the semiconductor device 1a, the input/output pad 84 may be electrically connected to the lower bonding pad 45 through conductive patterns 81, 24P, and 42S between the input/output pad 84 and the lower bonding pad 45. Accordingly, the input/output pad 84 may be electrically connected to the peripheral interconnection structure 65 of the peripheral circuit structure PTR and 65 through the lower bonding pad 45 and the upper bonding pad 77.

Figure 6:
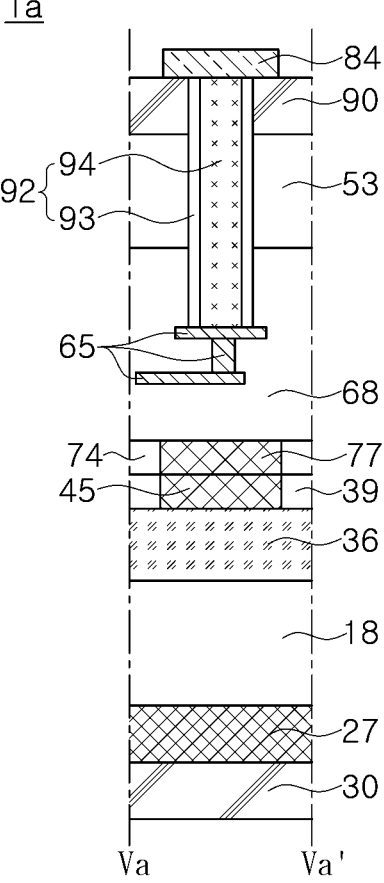
FIG. 6 is a schematic cross-sectional view illustrating a modification of a semiconductor device according to an example embodiment.

FIG. 6 is a schematic view illustrating a modification of a semiconductor device according to an example embodiment. FIG. 6 is a schematic cross-sectional view illustrating a region taken along line Va-Va' in FIG. 4.

Referring to FIG. 6, the input/output pad 84 in FIG. 5C may be replaced with an input/output pad 84' disposed on the upper substrate 53. For example, the semiconductor device 1a may further include an upper protective insulating layer 90 on the upper substrate 53, and the input/output pad 84' may be disposed on the upper protective insulating layer 90.

In the semiconductor device 1a, the conductive patterns 81, 24P, and 42S in FIG. 5C may be replaced with a through-electrode structure 92 between the input/output pad 84' and the peripheral interconnection structure 65. The through-electrode structure 92 may include a through-electrode 94 extending downward while passing through the upper protective insulating layer 90 and the upper substrate 53, and an insulating spacer 93 surrounding side surfaces of the through-electrode 94.

Figure 7:
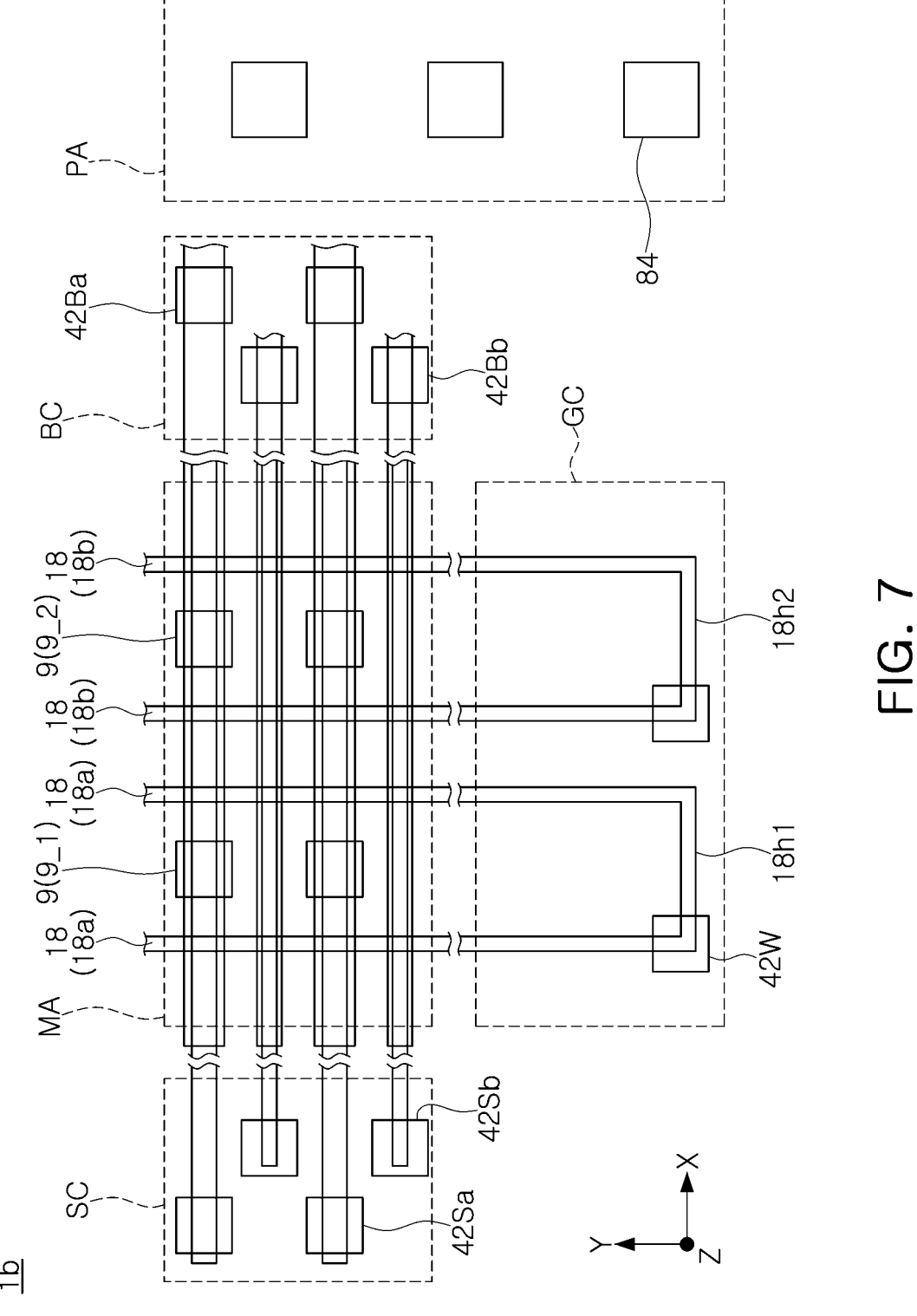
FIG. 7 is a schematic top view illustrating a modification of a semiconductor device according to an example embodiment.

FIG. 7 is a schematic view illustrating a modification of a semiconductor device according to an example embodiment, and is a schematic top view illustrating a modification of the intermediate conductive lines 18 in FIG. 4.

Referring to FIG. 7, among the intermediate conductive lines 18, a pair of intermediate conductive lines 18*a* and 18*b* adjacent to each other with the semiconductor patterns 9 interposed therebetween may be electrically connected to each other by horizontal connection patterns 18*h*1 and 18*h*2. For example, in FIG. 7, a pair of intermediate conductive lines 18*a* indicated by reference numeral 18*a* may extend in parallel with the first semiconductor pattern 9_1 interposed therebetween, and the pair of intermediate conductive lines 18*a* may be electrically connected to each other by the horizontal connection pattern 18*h*1 in the third contact region GC. Accordingly, the pair of intermediate conductive lines 18*a* electrically connected to each other by the horizontal connection pattern 18*h*1 may be one gate, and may be electrically connected to an intermediate contact plug 42W. Accordingly, one gate 18*a* may face opposite side surfaces of the first semiconductor pattern 9_1.

Figure 8:
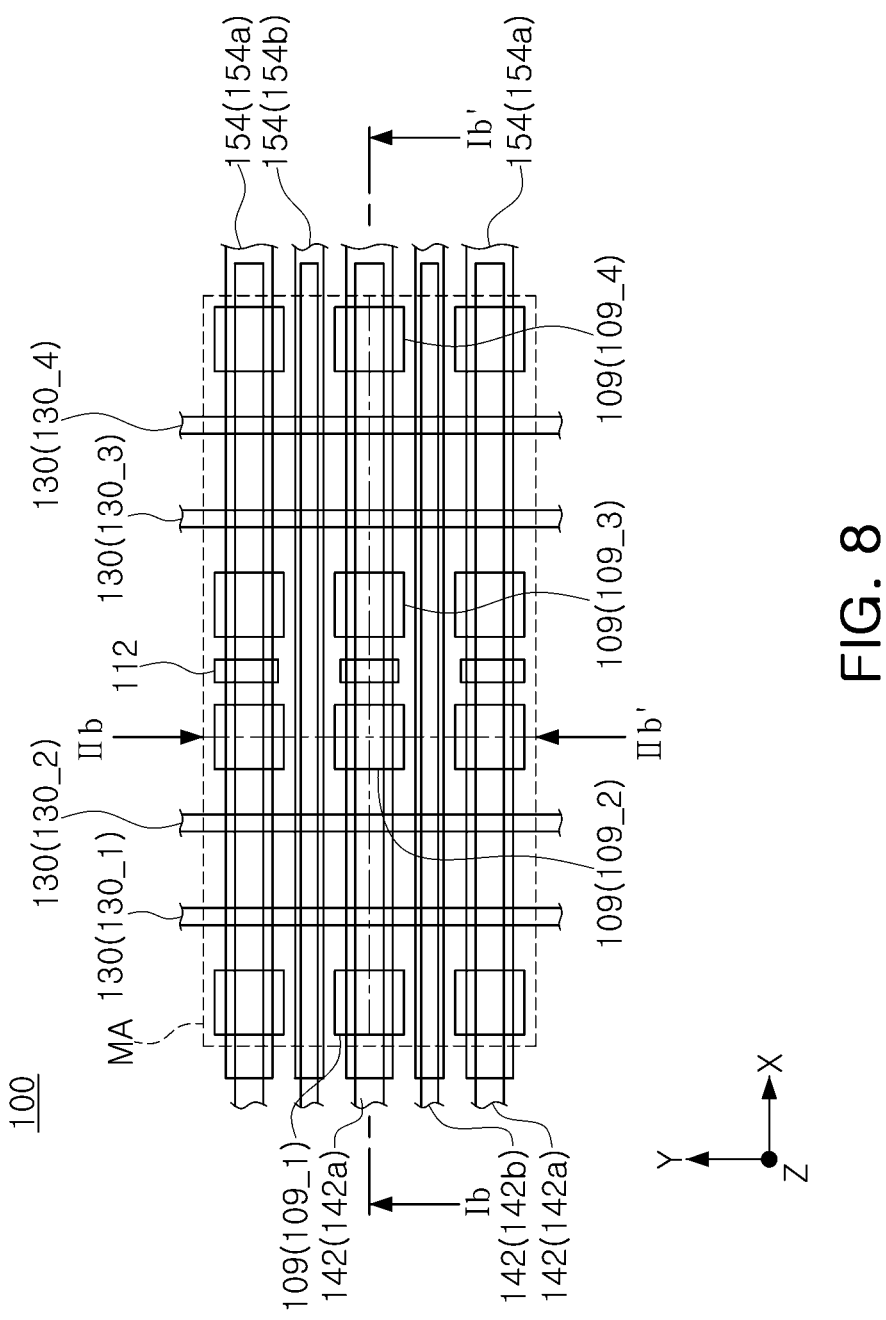
FIGS. 8 and 9 are schematic views illustrating a semiconductor device according to an example embodiment.
Figure 9:
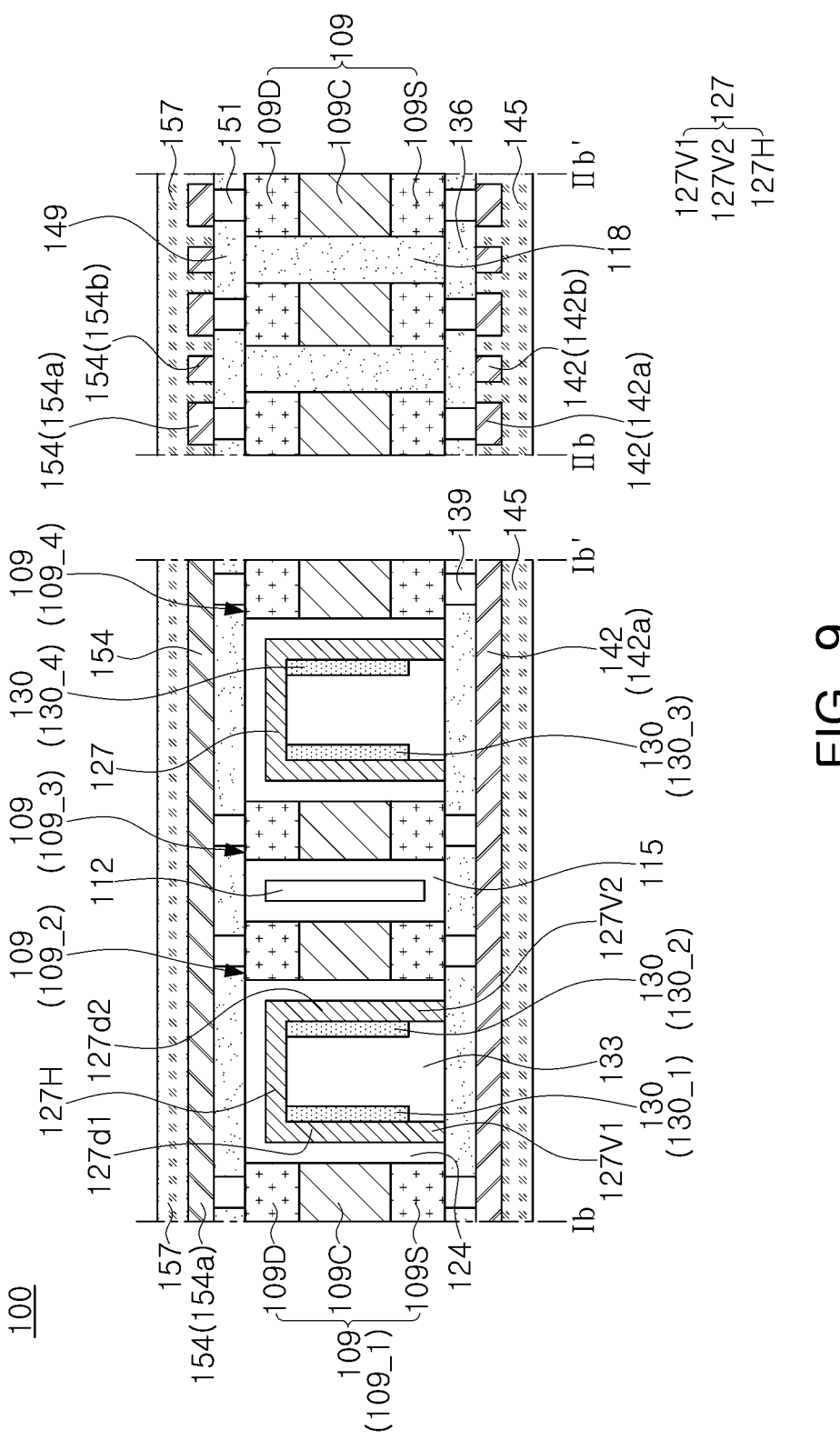

FIGS. 8 and 9 are schematic views illustrating a semiconductor device according to an example embodiment. FIG. 8 is a schematic top view illustrating a modification of a semiconductor device according to an example embodiment. FIG. 9 is a schematic cross-sectional view illustrating regions taken along lines Ib-Ib' and IIb-IIb' in FIG. 8.

Referring to FIGS. 8 and 9, the semiconductor device 100 may include lower conductive lines 142 disposed on a first height level, upper conductive lines 154 disposed on a second height level higher than the first height level, semiconductor patterns 109 disposed on a third height level between the first height level and the second height level, intermediate conductive lines 130 extending in a direction intersecting the upper conductive lines and passing between the semiconductor patterns, between the first height level and the second height level, and data storage layers 127 including regions interposed between the intermediate conductive lines 130 and the semiconductor patterns 109.

The lower conductive lines 142 may be formed of a material same as those of the lower conductive lines 24 in FIGS. 1 and 2. The upper conductive lines 154 may be formed of a material same as those of the upper conductive lines 33 in FIGS. 1 and 2. The intermediate conductive lines 130 may be formed of a material same as those of the intermediate conductive lines 18 in FIGS. 1 and 2. The semiconductor patterns 109 may be formed of a material same as those of the semiconductor patterns 9 in FIGS. 1 and 2. The data storage layers 127 may be formed of a material same as those of the data storage layers 15 in FIGS. 1 and 2.

Each of the lower conductive lines 142 may extend in a first direction X. The lower conductive lines 142 may be parallel to each other. The lower conductive lines 142 may include first lower conductive lines 142*a* and second lower conductive lines 142*b* alternately and repeatedly arranged in a second direction Y perpendicular to the first direction X. A width of each of the first lower conductive lines 142*a* may be greater than a width of each of the second lower conductive lines 142*b*.

Each of the upper conductive lines 154 may extend in the first direction X. The upper conductive lines 154 may be parallel to each other. The upper conductive lines 154 may include first upper conductive lines 154*a* and second upper conductive lines 154*b* alternately and repeatedly arranged in the second direction Y. A width of each of the first upper conductive lines 154*a* may be greater than a width of each of the second upper conductive lines 154*b*.

The semiconductor patterns 109 may be arranged in the first direction x and the second direction Y in the memory region MA of the semiconductor device 100. The semiconductor patterns 109 may be disposed between the first lower conductive lines 142*a* and the first upper conductive lines 154*a*. The semiconductor patterns 109 may vertically overlap the first lower conductive lines 142*a* and the first upper conductive lines 154*a*. The semiconductor patterns 109 may not vertically overlap the second lower conductive lines 142*b* and the second upper conductive lines 154*b*.

Each of the semiconductor patterns 109 may include a first source/drain region 109S, a second source/drain region 109D, and a channel region 109C between the first and second sources/drain regions 109S and 109D. The channel region 109C may be a vertical channel region.

The lower source/drain regions 109S of the semiconductor patterns 109 may be electrically connected to the first lower conductive lines 142*a*, and the upper source/drain regions 9D of the semiconductor patterns 109 may be electrically connected to the first upper conductive lines 154*a*.

The second lower conductive lines 142*b* may be electrically isolated from the semiconductor patterns 109. The second upper conductive lines 154*b* may be electrically isolated from the semiconductor patterns 109. The second lower conductive lines 142*b* may provide a function similar to the second lower conductive lines 24*a* in FIGS. 1 and 2, and the second upper conductive lines 154*b* may provide a function similar to the second upper conductive lines 33*b* in FIGS. 1 and 2. The second lower conductive lines 142*b* may be referred to as lower shielding lines, and the second upper conductive lines 154*b* may be referred to as upper shielding lines.

The semiconductor patterns 109 may include a first semiconductor pattern 109_1, a second semiconductor pattern 109_2, a third semiconductor pattern 109_3, and a fourth semiconductor pattern 109_4 sequentially arranged in the first direction X.

Each of the intermediate conductive lines 130 may extend in the second direction Y The intermediate conductive lines 130 may include a first intermediate conductive line 130_1 and a second intermediate conductive line 130_2 passing between the first and second semiconductor patterns 109_1 and 109_2. The first intermediate conductive line 130_1 and the second intermediate conductive line 130_2 may be parallel to each other, and a third intermediate conductive line 130_3 and a fourth intermediate conductive line 130_4 passing between the third and fourth semiconductor patterns 109_3 and 109_4, the third intermediate conductive line 130_3 and the fourth intermediate conductive line 130_4 may be parallel to each other. The intermediate conductive lines 130 may be gate lines.

The intermediate conductive lines 130 may not be disposed between the second and third semiconductor patterns 109_2 and 109_3.

In example embodiments, the first lower conductive lines 142A may be referred to as source lines, the first upper conductive lines 154*a* may be referred to as bit lines, and the intermediate conductive lines 130 may be referred to as gate lines or word lines.

Each of the data storage layers 127 may include a first vertical portion 127V1, a second vertical portion 127V2, and a horizontal portion 127H extending upper regions of the first vertical portion 127V1 and the second vertical portion 127V2 to connect the upper regions of the first vertical portion 127V1 and the second vertical portion 127V2 to each other.

The data storage layers 127 may include a first data storage layer. The first and second intermediate conductive lines 130_1 and 130_2 may pass between the first and second vertical portions 127V1 and 127V2 of the first data storage layer 127, and may vertically overlap the horizontal portion 127H. The horizontal portion 127H of the first data storage layer 127 may be disposed on the first and second intermediate conductive lines 130_1 and 130_2. In the data storage layers 127, the first and second vertical portions 127V1 and 127V2 may include regions 127d1 and 127d2 facing at least the channel regions 109C.

The semiconductor device 100 may further include insulating layers 124 including first portions disposed between the first vertical portions 127V1 of the data storage layers 127 and the semiconductor patterns 109, and second portions disposed between the second vertical portions 127V2 of the data storage layers 127 and the semiconductor patterns 109. The insulating layers 124 may further include third portions covering the horizontal portions 127H of the data storage layers 127. The insulating layers 124 may be substantially similar to the insulating layers 12 described with reference to FIGS. 1 and 2.

The semiconductor device 100 may further include a lower capping layer 145 covering the lower conductive lines 142 and an upper capping layer 157 covering the upper conductive lines 154. The lower and upper capping layers 145 and 157 may be formed of an insulating material such as silicon oxide and/or silicon nitride.

The semiconductor device 100 may further include first intermediate insulating layers 133 disposed between the first and second vertical portions 127V1 and 127V2, and second intermediate insulating layers 118 disposed between the semiconductor patterns 109 arranged in the second direction Y The intermediate conductive lines 130 may be disposed between the first intermediate insulating layers 133 and the data storage layers 127. The first and second intermediate insulating layers 133 and 118 may be formed of an insulating material such as silicon oxide, silicon oxynitride, or silicon nitride. In an example, the first and second intermediate insulating layers 133 and 118 may be formed of the same material. In another example, the first and second intermediate insulating layers 131 and 118 may be formed of different materials.

The semiconductor device 100 may further include a third intermediate insulating layer 115 including an air gap 112 disposed between the second and third semiconductor patterns 109_2 and 109_3. A plurality of air gaps 112 may be disposed, and the plurality of air gaps 112 may be arranged while being spaced apart from each other in the second direction Y.

The semiconductor device 100 may further include a lower interlayer insulating layer 136 and an upper interlayer insulating layer 149.

The lower interlayer insulating layer 136 may be disposed on the lower conductive lines 142 and the lower capping layer 145, and may be disposed below the semiconductor patterns 109, the first to third intermediate insulating layers 133, 118, and 115, and the data storage layers 127.

The upper interlayer insulating layer 149 may be disposed below the upper conductive lines 154 and the upper capping layer 157, and may be disposed on the semiconductor patterns 109, the first to third intermediate insulating layers 133, 118, and 115, the insulating layers 124, and the data storage layers 127.

The semiconductor device 100 may further include lower contact plugs 139p passing through the lower interlayer insulating layer 136 between the first lower conductive lines 142a and the lower source/drain regions 109S, and electrically connecting the first lower conductive lines 142a and the lower source/drain regions 109S to each other, and upper contact plugs 151p passing through the upper interlayer insulating layer 149 between the first upper conductive lines 154a and the upper source/drain regions 109D, and electrically connecting the first upper conductive lines 154a and the upper source/drain regions 109D to each other.

Figure 10:
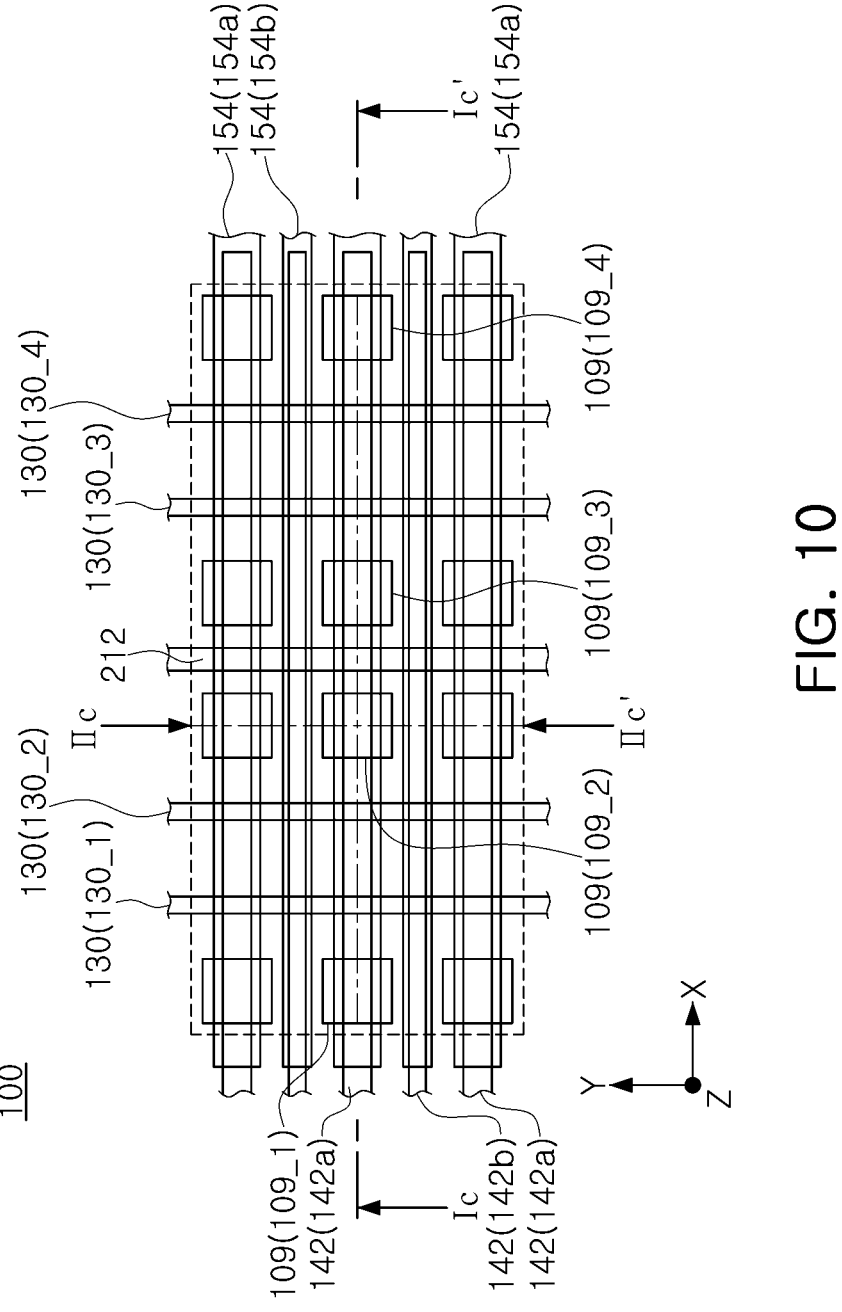
FIGS. 10 and 11 are schematic views illustrating a semiconductor device according to an example embodiment.
Figure 11:
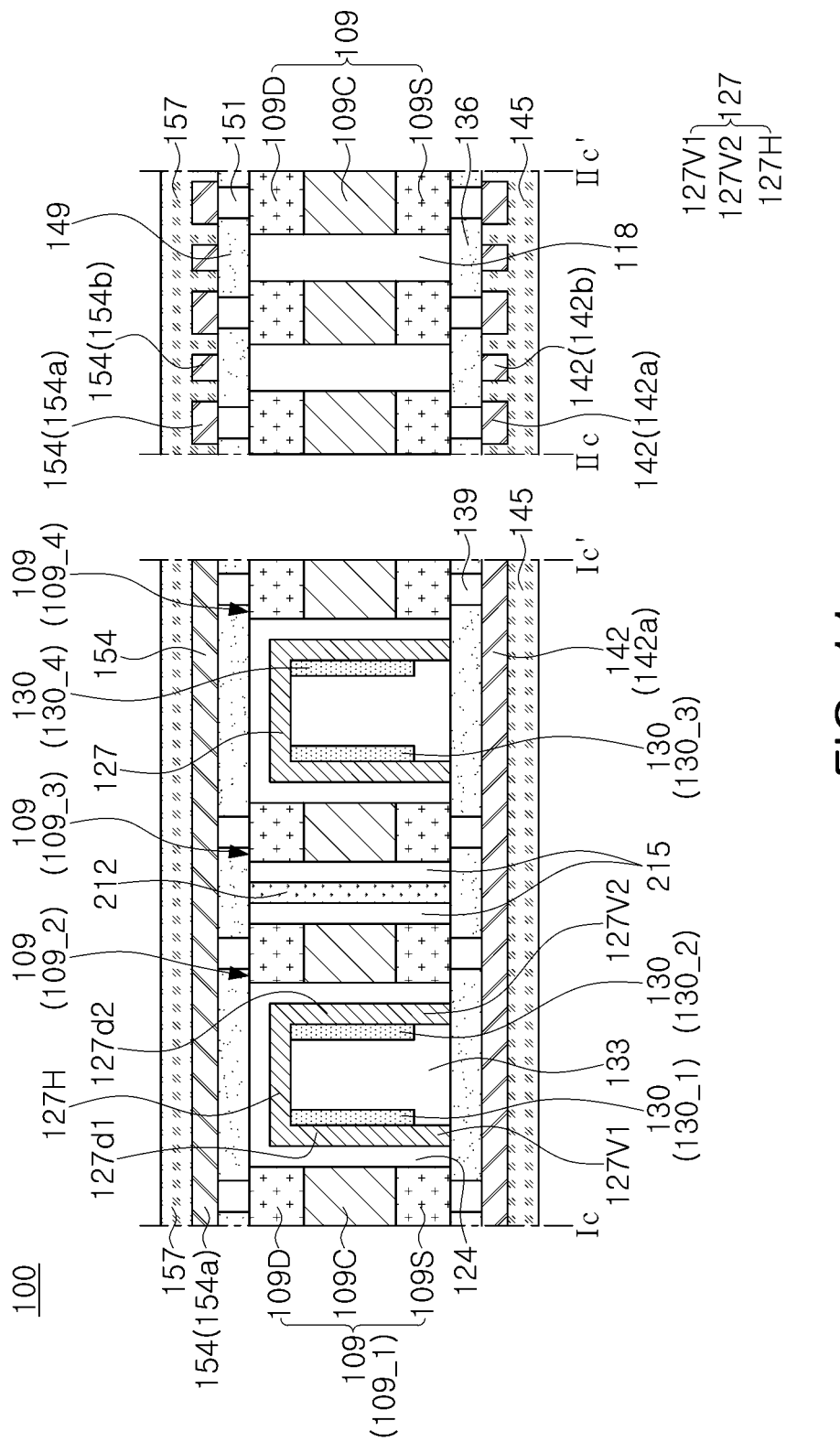

FIGS. 10 and 11 are schematic views illustrating a modification of a semiconductor device according to an example embodiment. FIG. 10 is a schematic top view illustrating a modification of a semiconductor device according to an example embodiment. FIG. 11 is a schematic cross-sectional view illustrating regions taken along lines Ic-Ic' and IIc-IIc' in FIG. 10.

Referring to FIGS. 10 and 11, in the semiconductor device 100 described with reference to FIGS. 9 and 10, the air gap 112 may be replaced with an intermediate shielding line 212 extending in the second direction Y, and the third intermediate insulating layer (115 in FIG. 9) may be replaced with a third intermediate insulating layer 215 covering side surfaces of the intermediate shielding line 212.

The intermediate shielding line 212 may be formed of a conductive material. The intermediate shielding line 212 may include doped polysilicon, a metal, a conductive metal nitride, a metal-semiconductor compound, a conductive metal oxide, a conductive graphene, carbon nanotubes, or a combination thereof. For example, the intermediate shielding line 212 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrCO$_x$, RuO$_x$, graphene, carbon nanotubes, or a combination thereof, but is not limited thereto. The intermediate shielding line 212 may include a single layer or multiple layers of the materials described above.

In an example, the intermediate shielding line 212 may be formed of a material same as those of the intermediate conductive lines 130. In another example, the intermediate shielding line 212 may be formed of a material different from those of the intermediate conductive lines 130.

A lower surface of the intermediate shielding line 212 may be coplanar with lower surfaces of the semiconductor patterns 109. An upper surface of the intermediate shielding line 212 may be coplanar with upper surfaces of the semiconductor patterns 109.

Figure 12:
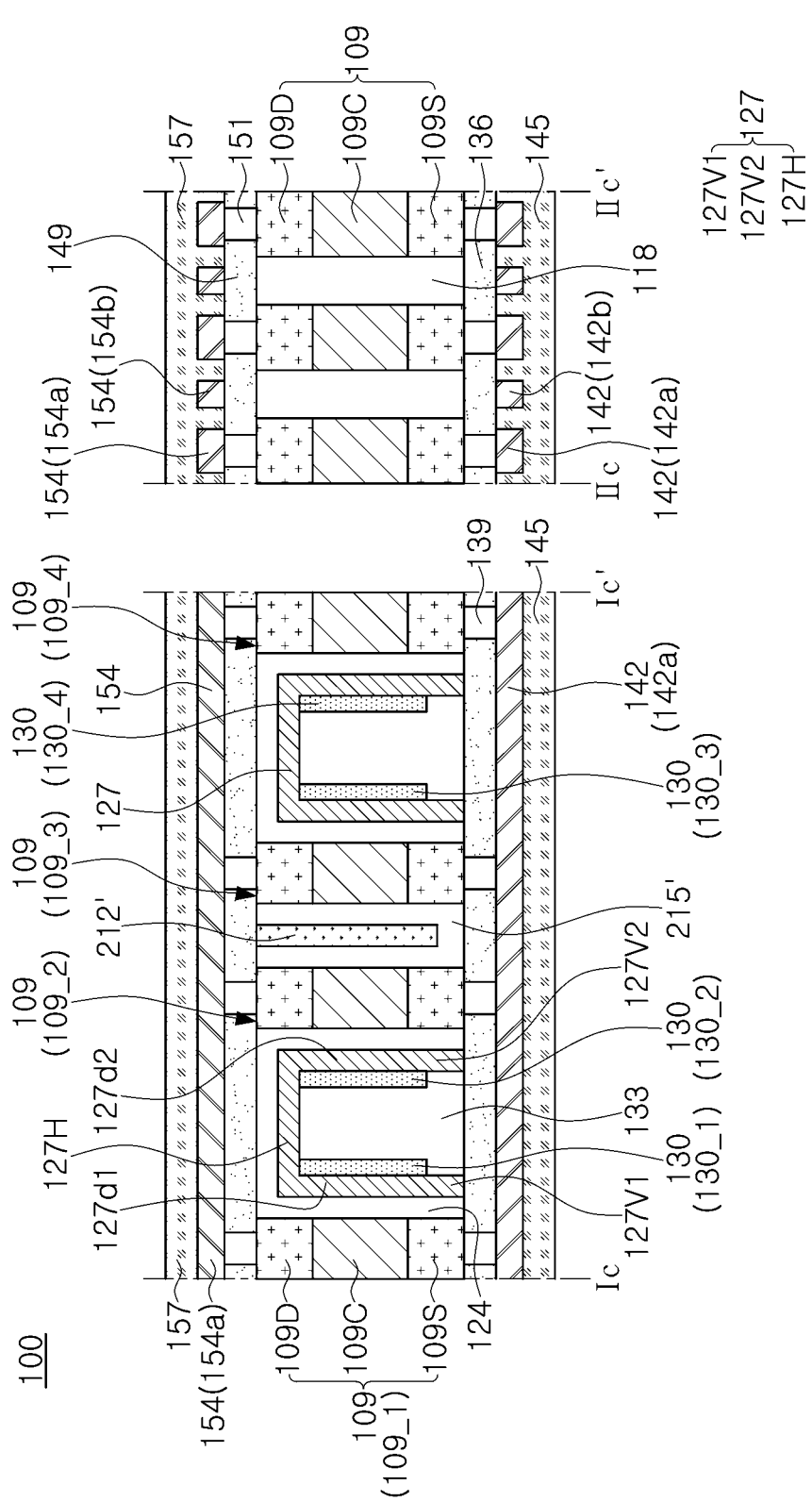
FIG. 12 is a schematic cross-sectional view illustrating a modification of a semiconductor device according to an example embodiment.

FIG. 12 is a schematic cross-sectional view illustrating a modification of a semiconductor device according to an example embodiment. FIG. 12 is a schematic cross-sectional view illustrating regions taken along lines Ic-Ic' and IIc-IIc' in FIG. 10.

Referring to FIG. 12, the intermediate shielding line 212 in FIG. 11 may be modified into an intermediate shielding line 212' having a lower surface positioned on a higher level than those of lower surfaces of the semiconductor patterns 109. The third intermediate insulating layer 215 in FIG. 11 may be modified into a third intermediate insulating layer 215' covering the lower surface and side surfaces of the intermediate shielding line 212'.

Figure 13:
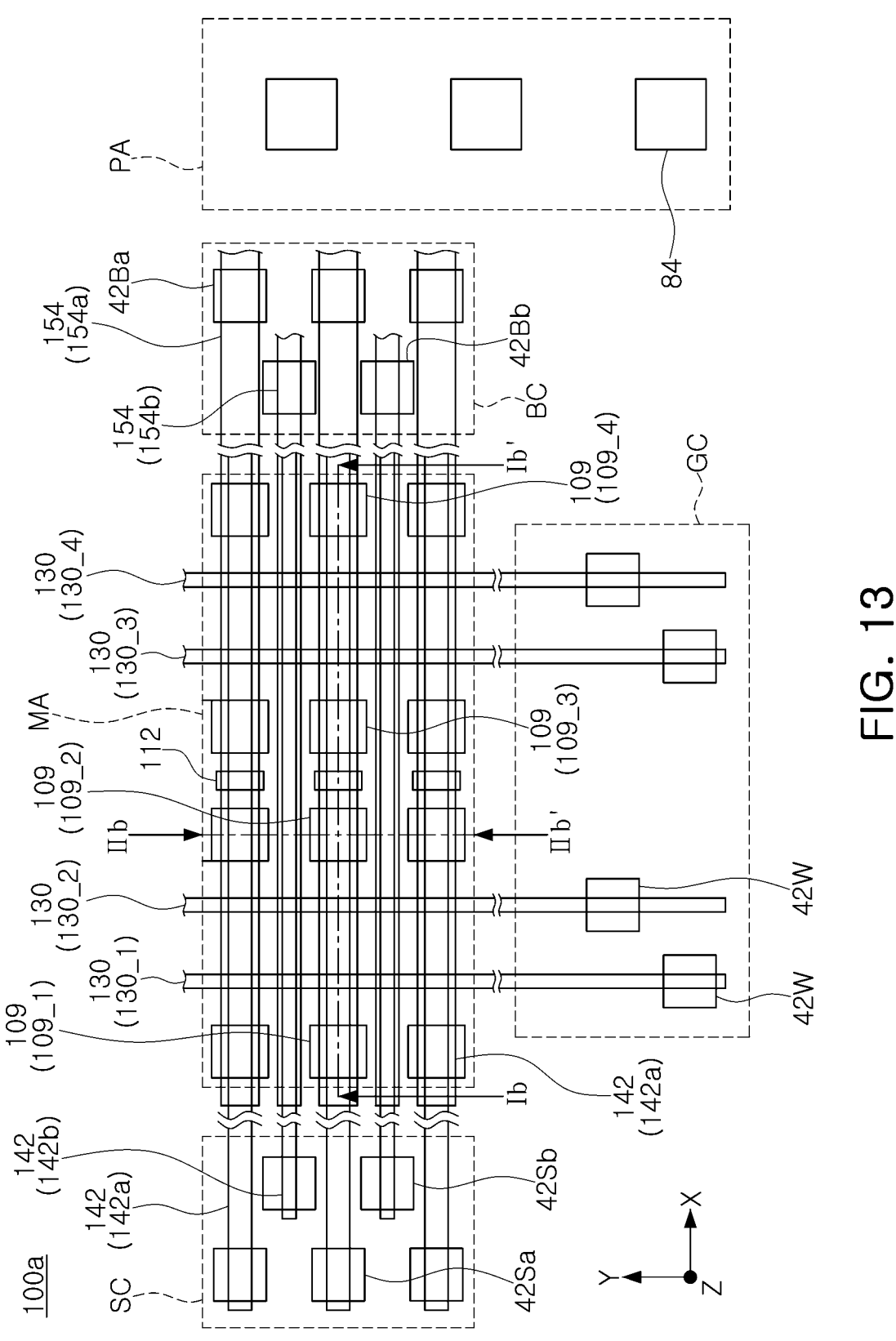
FIGS. 13 and 14 are schematic views illustrating a semiconductor device according to an example embodiment.
Figure 14:
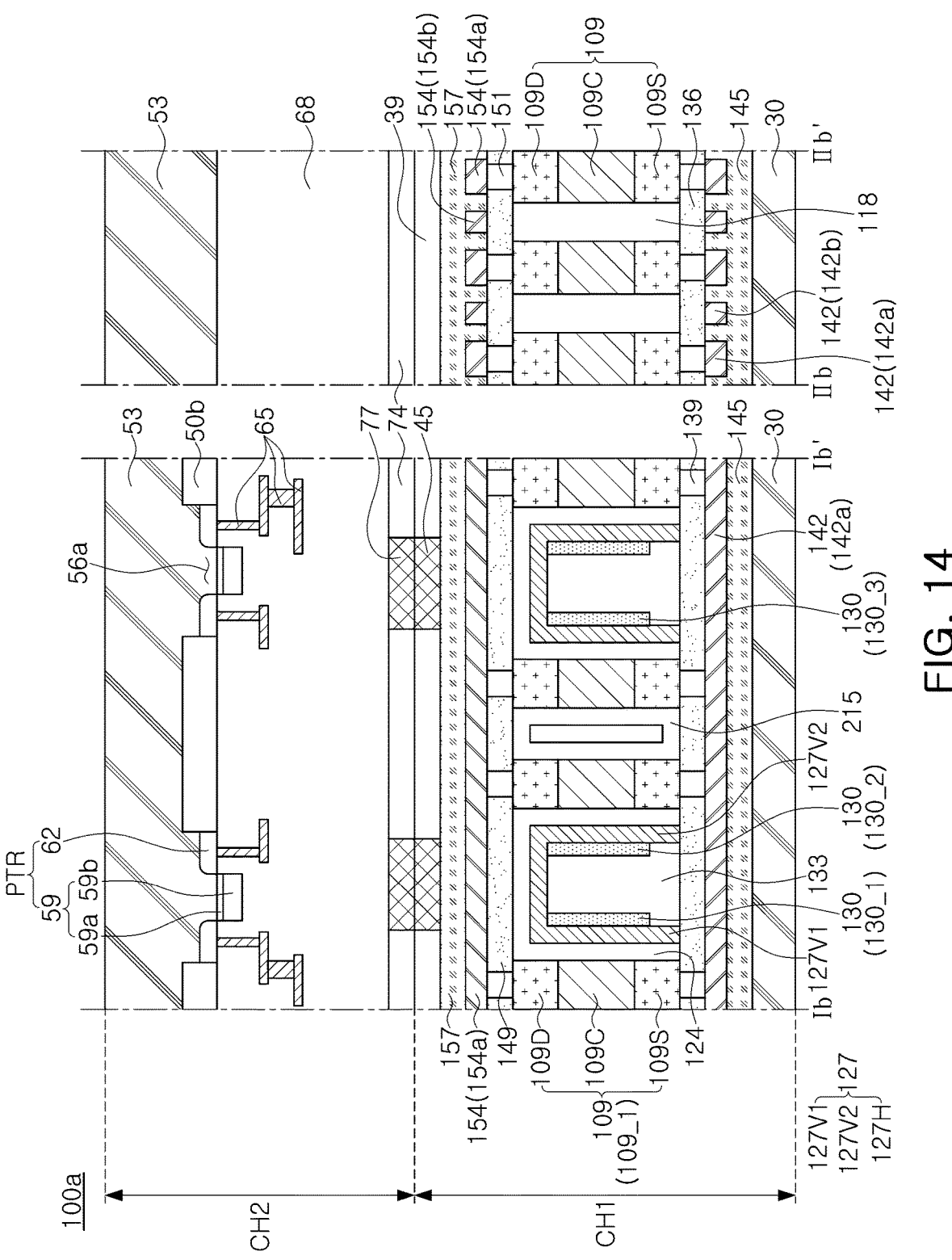

FIGS. 13 and 14 are schematic views illustrating a modification of a semiconductor device according to an example embodiment. FIG. 13 is a schematic top view illustrating a modification of a semiconductor device according to an example embodiment. FIG. 14 is a schematic cross-sectional view illustrating regions taken along lines Ib-Ib' and IIb-IIb' in FIG. 13.

Referring to FIGS. 13 and 14, the semiconductor device 100a may further include a first contact region SC and a second contact region BC disposed on opposite sides of the memory region MA described with reference to FIGS. 8 and 9. The first contact region SC, the memory region MA, and the second contact region BC may be sequentially arranged in the first direction X. The semiconductor device 100a may further include a third contact region GC sequentially arranged with the memory region MA in the second direction Y.

In the semiconductor device 100a, the lower conductive lines 142 may extend from the memory region MA into the first contact region SC, the upper conductive lines 154 may extend from the memory region MA into the second contact region BC, and the intermediate conductive lines 130 may extend from the memory region MA into the third contact region GC.

As described with reference to FIGS. 8 and 9, the semiconductor device 100a may further include first lower contact plugs 42Sa electrically connected to the first lower conductive lines 142a and second lower contact plugs 42Sb electrically connected to the second lower conductive lines 142b in the first contact region SC, first upper contact plugs 42Ba electrically connected to the first upper conductive lines 154a and second upper contact plugs 42Bb electrically connected to the second upper conductive lines 154b in the second contact region BC, and intermediate contact plugs 42W electrically connected to the intermediate conductive lines 130 in the third contact region GC.

As illustrated in FIG. 14, the semiconductor device 100a may further include a base 30 below the lower capping layer 145. The semiconductor device 100a may further include a lower bonding insulating layer 39 on the upper capping layer 157, and lower bonding pads 45 embedded in the lower bonding insulating layer 39, the lower bonding pads 45 respectively having an upper surface coplanar with an upper surface of the lower bonding insulating layer 39. The first and second lower contact plugs 42Sa and 42Sb, the first and second upper contact plugs 42Ba and 42Bb, and the second intermediate contact plugs 42W may be electrically connected to the lower bonding pads 45.

In the semiconductor device 100a, a structure from a lower surface of the base 30 to the upper surfaces of the lower bonding insulating layer 39 and the lower bonding pads 45 may be referred to as a lower chip structure CH1.

The semiconductor device 100a may further include an upper chip structure CH2 as illustrated in FIGS. 5A to 5C. The upper chip structure CH2 may be on, in contact with and bonded to the lower chip structure CH1.

The semiconductor device 100a may further include an input/output pad region PA in which the input/output pad 84 is disposed, as illustrated in FIG. 4. In an example, the input/output pad 84 may be disposed on a lower portion of the lower chip structure CH1. In another example, the input/output pad 84 may be disposed on an upper portion of the upper chip structure CH2.

Figure 15:
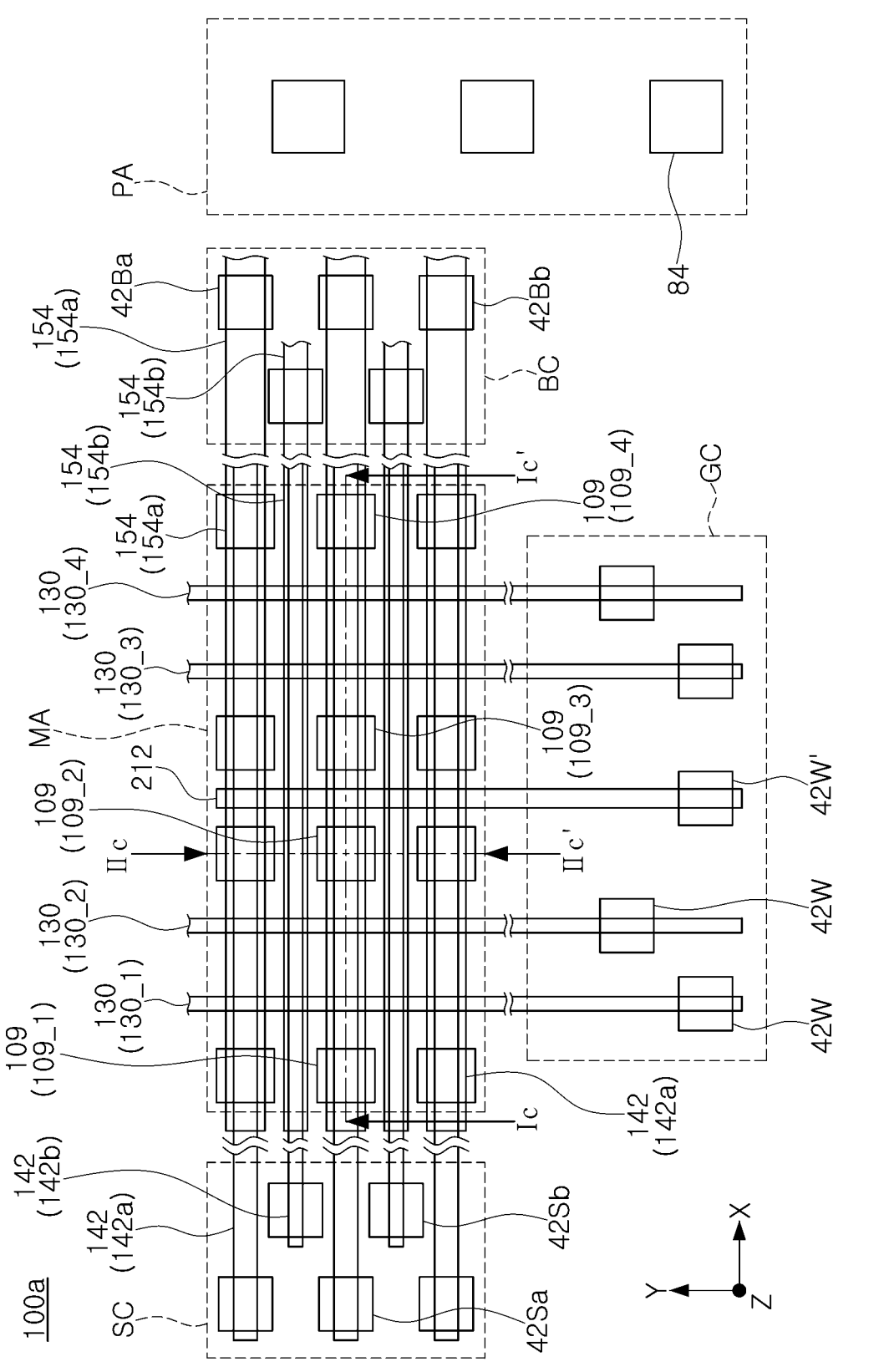
FIGS. 15 and 16 are schematic views illustrating a semiconductor device according to an example embodiment.
Figure 16:
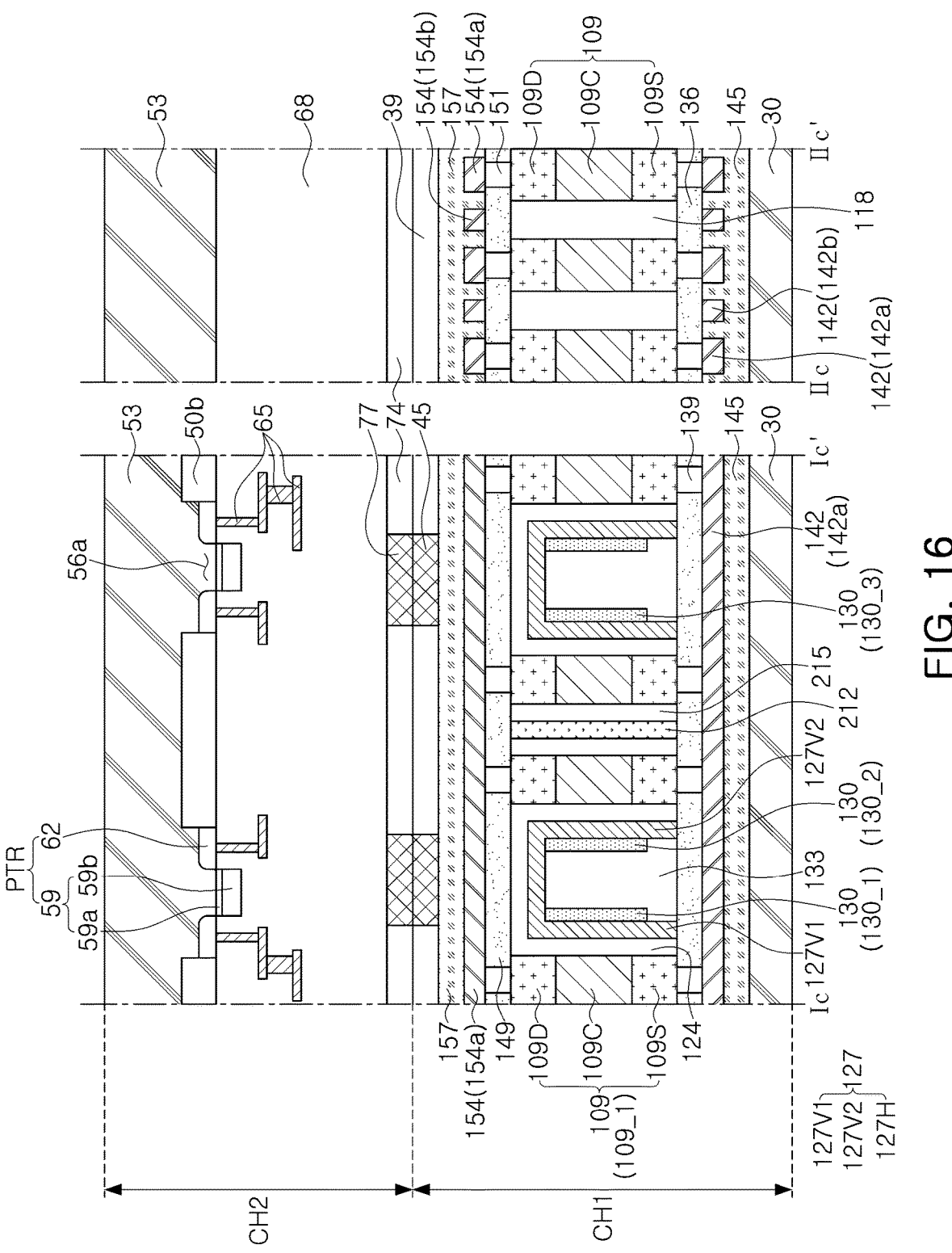

FIGS. 15 and 16 are schematic views illustrating a semiconductor device according to an example embodiment. FIG. 15 is a schematic top view illustrating a modification of a semiconductor device according to an example embodiment. FIG. 16 is a schematic cross-sectional view illustrating regions taken along lines Ic-Ic' and IIc-IIc' in FIG. 15.

Referring to FIGS. 15 and 16, the air gaps 112 illustrated in FIGS. 8 and 9 may be replaced with the intermediate shielding line 212. Accordingly, as illustrated in FIGS. 15 and 16, the intermediate shielding line 212 may extend from the memory region MA into the third contact region GC. The semiconductor device 100a may further include a contact plug 42W' electrically connected to the intermediate shielding line 212 in the third contact region GC.

Next, an example of a method of forming a semiconductor device according to an example embodiment will be described with reference to FIGS. 17 to 24. FIGS. 17 to 24 are cross-sectional views illustrating regions corresponding to lines II' and II-II' in FIG. 1.

Figure 17:
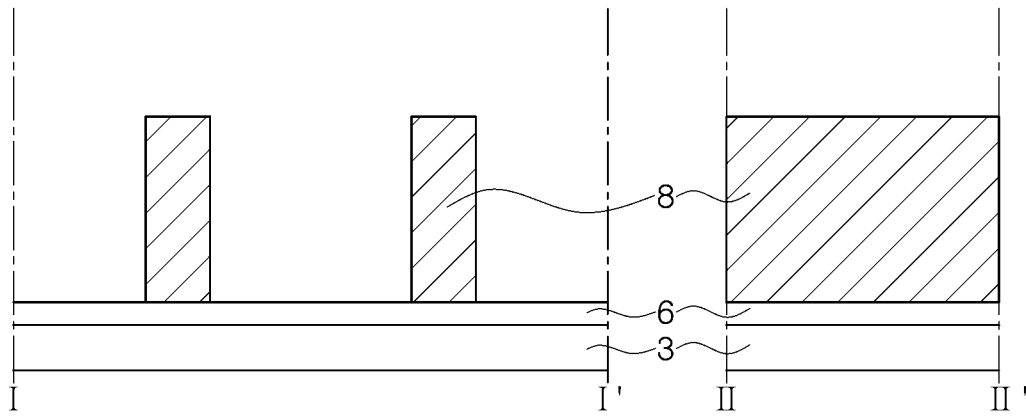
FIGS. 17 to 24 are schematic cross-sectional views illustrating an example of a method of forming a semiconductor device according to an example embodiment.

Referring to FIGS. 1 and 17, semiconductor lines 8 may be formed using a silicon on insulator (SOI) substrate. For example, in an SOI substrate including a single crystal semiconductor layer—an insulating layer—a single crystal semiconductor layer, the semiconductor lines 8 may be formed by patterning an upper single crystal semiconductor layer. Accordingly, the semiconductor lines 8 may be formed on an insulating layer 6 of the SOI substrate. The insulating layer 6 may be formed on a lower substrate 3, which may be a single crystal semiconductor layer of the SOI substrate. The semiconductor lines 8 may be formed of a single crystal semiconductor, for example, single crystal silicon.

Figure 18:
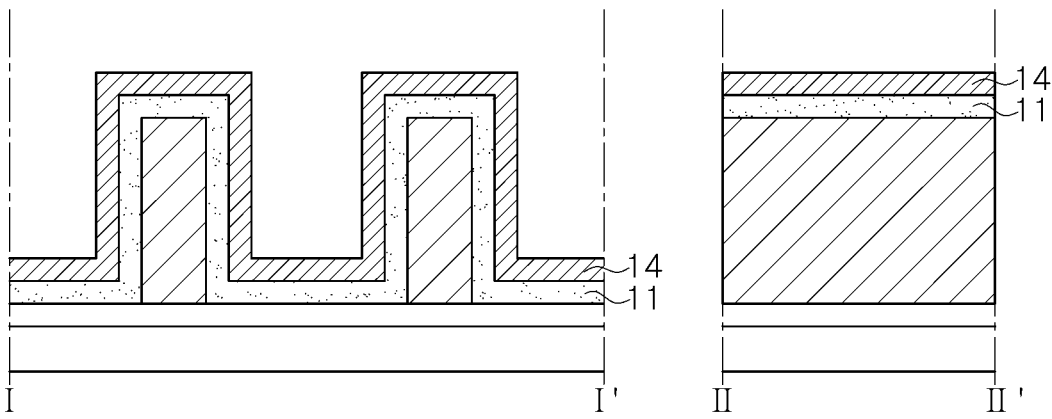

Referring to FIGS. 1 and 18, the insulating layer 11 and the data storage layer 14 sequentially stacked on a structure in which the semiconductor lines 8 are formed may be conformally formed. For example, the insulating layer 11 may cover an upper surface and side surfaces of each of the semiconductor lines 8, and cover an upper surface of the insulating layer 6 not overlapping the semiconductor lines 8. The data storage layer 14 may be formed on the insulating layer 11. The insulating layer 11 may include at least one of silicon oxide, silicon oxynitride, and a high-κ dielectric. The data storage layer 14 may include a material capable of storing data in a memory, for example, a ferroelectric.

Figure 19:
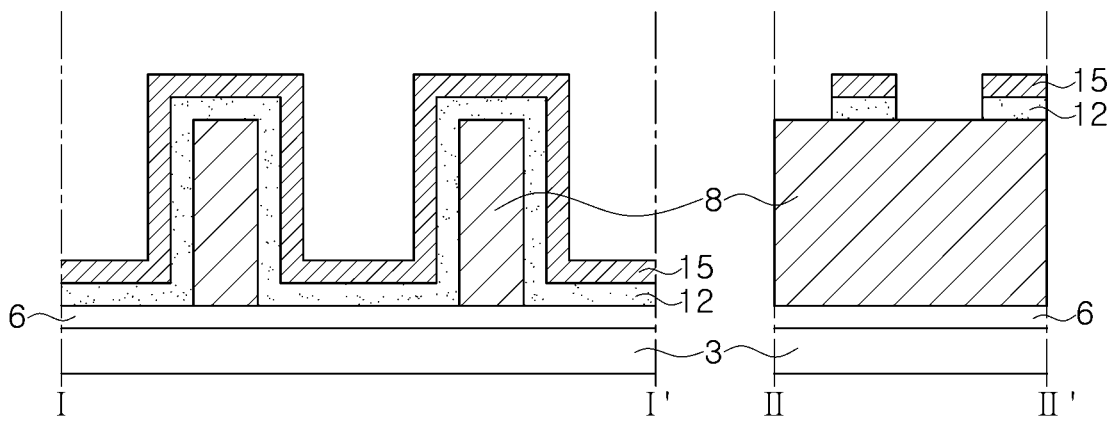

Referring to FIGS. 1 and 19, the insulating layer 11 and the data storage layer 14 sequentially stacked may be patterned to form the patterned insulating layer 12 and data storage layer 15. The patterned insulating layer 12 and data storage layer 15 may be formed to have a line shape.

In another example, the patterning of the insulating layer 11 and the data storage layer 14 may be omitted.

Figure 20:
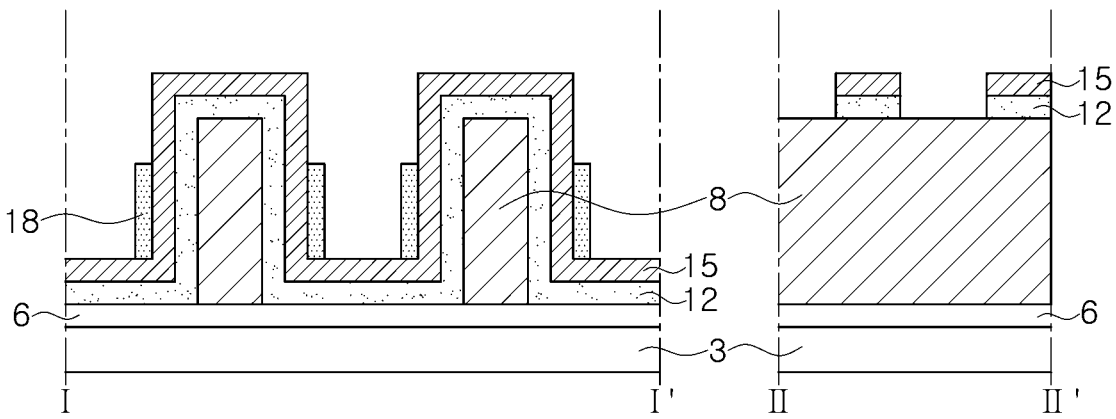

Referring to FIGS. 1 and 20, a conductive layer may be formed on the data storage layer 15, and the conductive layer may be anisotropically etched to form intermediate conductive lines 18. The intermediate conductive lines 18 may be formed between the semiconductor lines 8. The intermediate conductive lines 18 may be formed to have upper ends positioned at a level lower than those of upper surfaces of the semiconductor lines 8. A pair of intermediate conductive lines among the intermediate conductive lines 18 may be formed between a pair of semiconductor lines adjacent to each other among the semiconductor lines 8.

Figure 21:
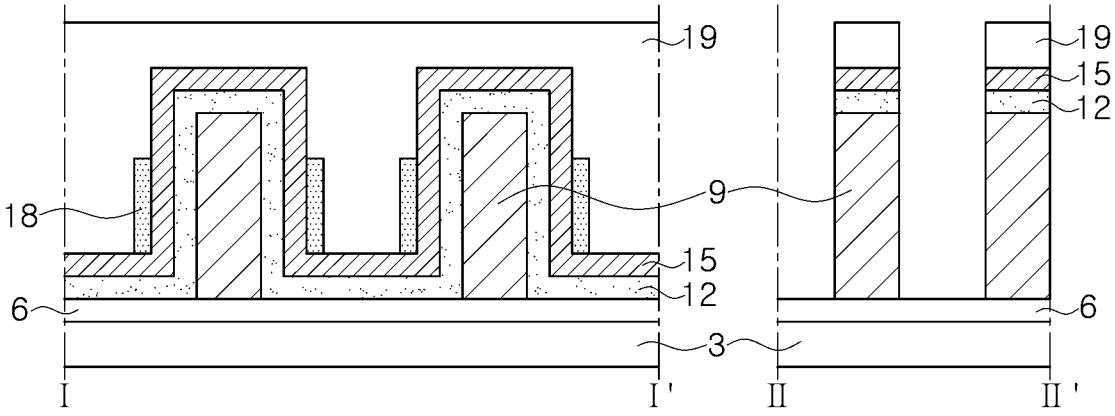

Referring to FIGS. 1 and 21, a first intermediate insulating layer 19 having openings may be formed on a structure formed up to the intermediate conductive lines 18, and semiconductor patterns 9 remaining below the first intermediate insulating layer 19 may be formed by performing an etching process in which the semiconductor lines 8 below the openings are etched and removed.

Figure 22:
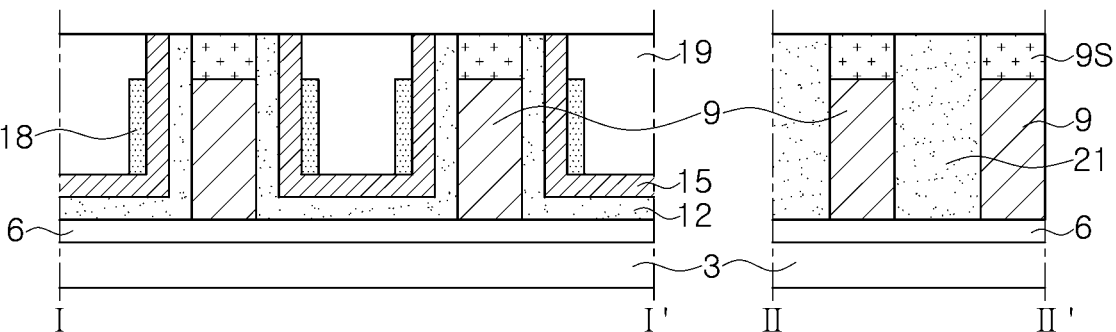

Referring to FIGS. 1 and 22, a second intermediate insulating layer 21 filling spaces removed by etching the semiconductor lines 8 may be formed, and a planarization process may be performed. For example, the planarization process may be performed until upper surfaces of the semiconductor patterns 9 are exposed. First source/drain regions 9S may be formed in the semiconductor patterns 9. The first source/drain regions 9S may be formed in upper regions of the semiconductor patterns 9.

Figure 23:
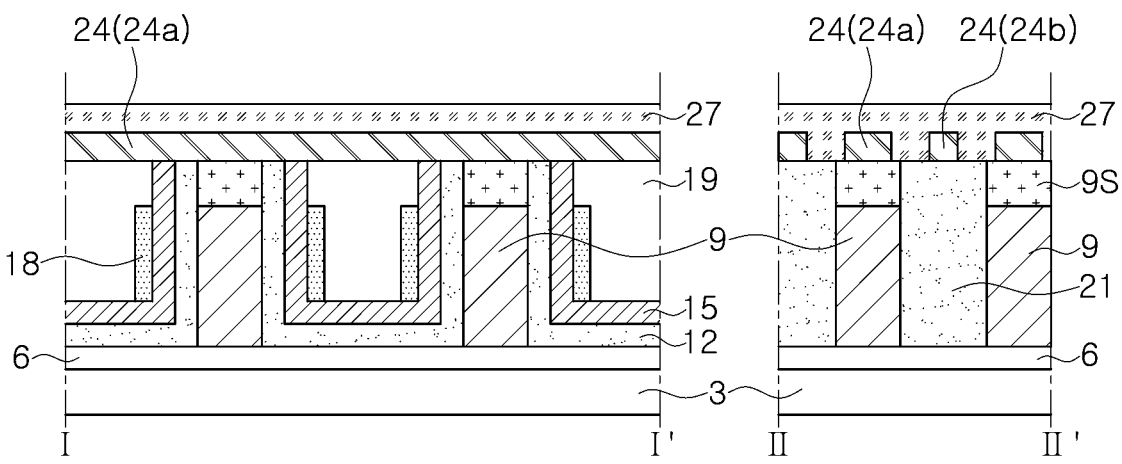

Referring to FIGS. 1 and 23, lower conductive lines 24 may be formed. The lower conductive lines 24 may include first lower conductive lines 24a electrically connected to the first source/drain regions 9S, and second lower conductive lines 24b disposed between the and the first lower conductive lines 24a, and electrically isolated from the first source/ drain regions 9S. A lower capping layer 27 may be formed on the lower conductive lines 24.

Figure 24:
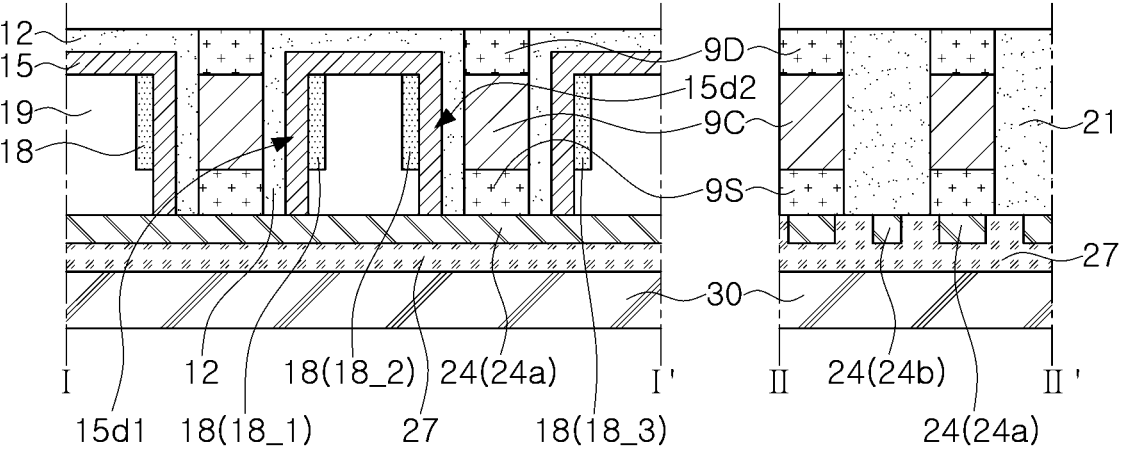

Referring to FIGS. 1 and 24, a base 30 may be formed on the lower capping layer 27. The base 30 may be formed of a dummy wafer, for example, a dummy semiconductor substrate. Subsequently, the lower substrate 3 and the insulating layer 6 may be sequentially removed. Accordingly, as the insulating layer 6 is removed, surfaces of the semiconductor patterns 9 may be exposed.

As illustrated in FIG. 24, it can be seen that the base 30 is positioned on a lower portion, and the semiconductor patterns 9 are positioned on the base 30. The following descriptions will be based on a cross-sectional shape in which the base 30 is positioned on a lower portion, and the semiconductor patterns 9 are positioned on the base 30. For example, the first source/drain regions 9S may be formed in lower regions of the semiconductor patterns 9, and the surfaces of the semiconductor patterns 9 exposed by the removed insulating layer 6 may be referred to as upper surfaces of the semiconductor patterns 9.

Second source/drain regions 9D may be formed in upper regions of the semiconductor patterns 9. Accordingly, each of the semiconductor patterns 9 may include the first source/drain region 9S, the second source/drain region 9D, and a channel regions 9C between the first and second source/drain regions 9S and 9D.

Referring back to FIGS. 1 and 2, upper conductive lines 33 may be formed. The upper conductive lines 33 may include first conductive lines 33a electrically connected to the second source/drain regions 9D, and second conductive lines 33b disposed between the first conductive lines 33a and electrically isolated from the source/drain regions 9D. An upper capping layer 36 covering the upper conductive lines 33 may be formed. Accordingly, the semiconductor device 1 illustrated in FIGS. 1 and 2 may be formed.

Another example of a method of forming a semiconductor device according to an example embodiment will be described with reference to FIGS. 8 and 25 to 31. FIGS. 25 to 31 are cross-sectional views illustrating regions corresponding to lines Ib-Ib' and IIb-IIb' in FIG. 8.

Figure 25:
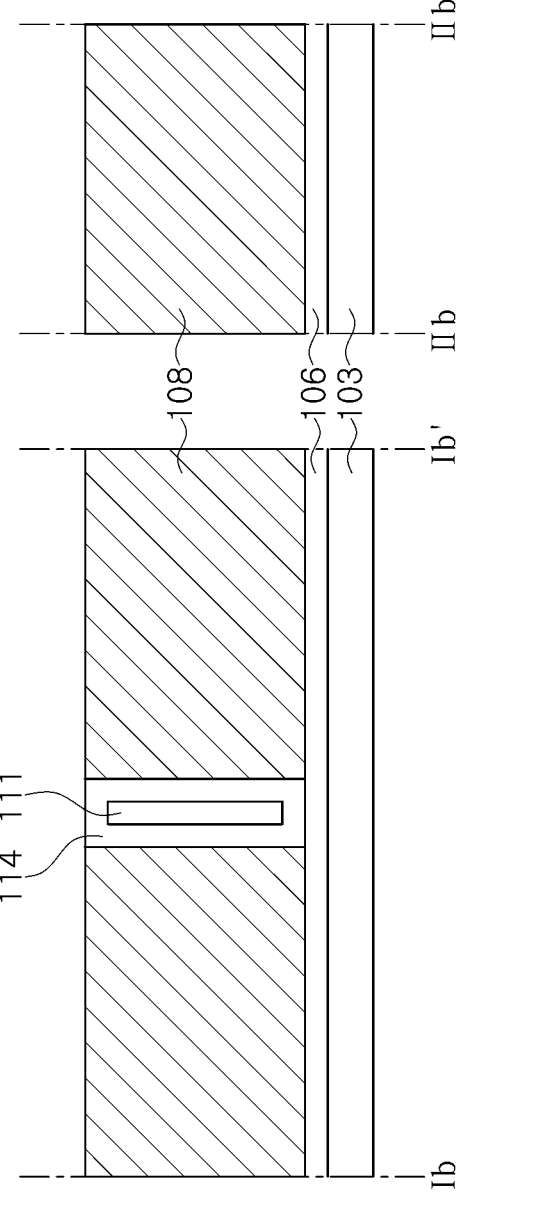
FIGS. 25 to 31 are schematic cross-sectional views illustrating another example of a method of forming a semiconductor device according to an example embodiment.

Referring to FIGS. 8 and 25, semiconductor lines 108 may be formed using the SOI substrate illustrated in FIG. 17. For example, in an SOI substrate including a single crystal semiconductor layer—an insulating layer—a single crystal semiconductor layer, the semiconductor lines 108 may be formed by patterning an upper single crystal semiconductor layer. Accordingly, the semiconductor lines 108 may be formed on an insulating layer 106 of the SOI substrate. The insulating layer 106 may be formed on a lower substrate 103, which may be a single crystal semiconductor layer of the SOI substrate. The semiconductor lines 108 may be formed of a single crystal semiconductor, for example, single crystal silicon.

An insulating layer 114 having an air gap 111 may be formed between the semiconductor lines 108.

Figure 26:
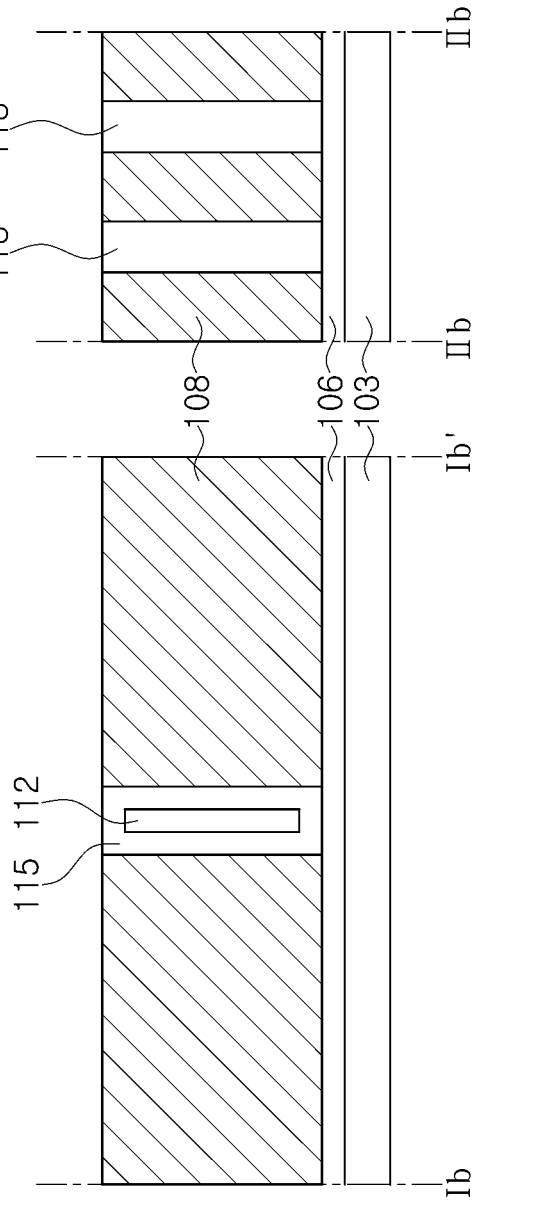

Referring to FIGS. 8 and 26, insulating layers 118 crossing and passing through the semiconductor lines 108 and the insulating layer 114 may be formed. For example, the semiconductor lines 108 may have a line shape extending in a second direction Y, and the insulating layers 118 may have a line shape extending in a first direction X perpendicular to the second direction Y. Accordingly, the semiconductor lines 108 may be formed to have bar shapes spaced apart from each other by the insulating layers 118. The air gap 111 may be formed as air gaps 112 spaced apart from each other by the insulating layers 118, and the insulating layer 114 may be formed as insulating layers 115 spaced apart from each other by the insulating layers 118. The insulating layers 115 may be referred to as third intermediate insulating layers 115, and the insulating layers 118 may be referred to as second intermediate insulating layers 118.

Figure 27:
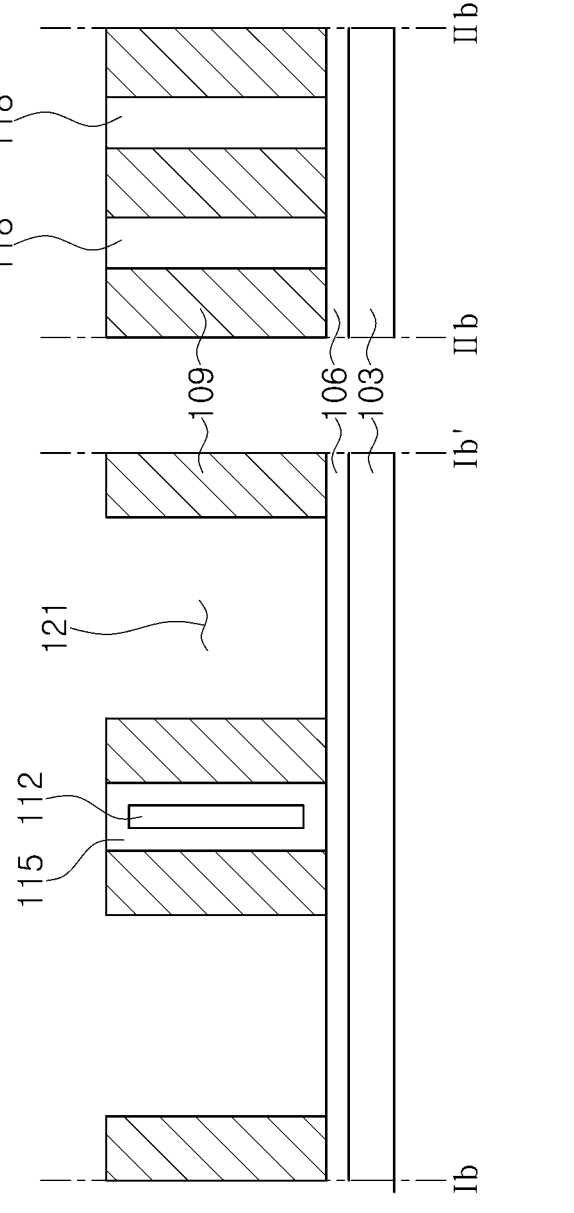

Referring to FIGS. 8 and 27, openings 121 crossing and passing through the semiconductor lines 108 and the second intermediate insulating layers 118 may be formed. The openings 121 may have a line shape extending in the second direction Y. The semiconductor lines 108 may be formed as semiconductor patterns 109 arranged in the first direction X and the second direction Y by the openings 121 and the second intermediate insulating layers 118.

Figure 28:
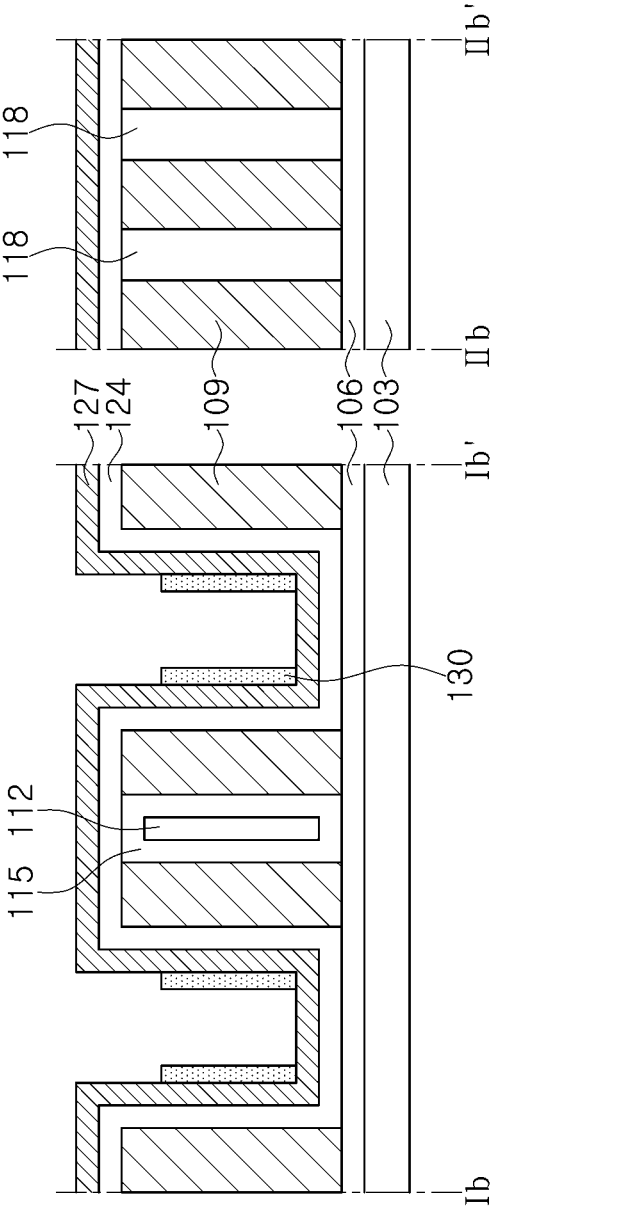

Referring to FIGS. 8 and 28, an insulating layer 124 and a data storage layer 127 may be sequentially formed on a structure formed up to the openings (121 in FIG. 27). A conductive layer may be formed on the data storage layer 127, and the conductive layer may be anisotropically etched to form intermediate conductive lines 130. The intermediate conductive lines 130 may be formed on the data storage layer 127 in the openings 121. The intermediate conductive lines 130 may be formed to have upper ends positioned at a level lower than those of upper surfaces of the semiconductor patterns 109.

Figure 29:
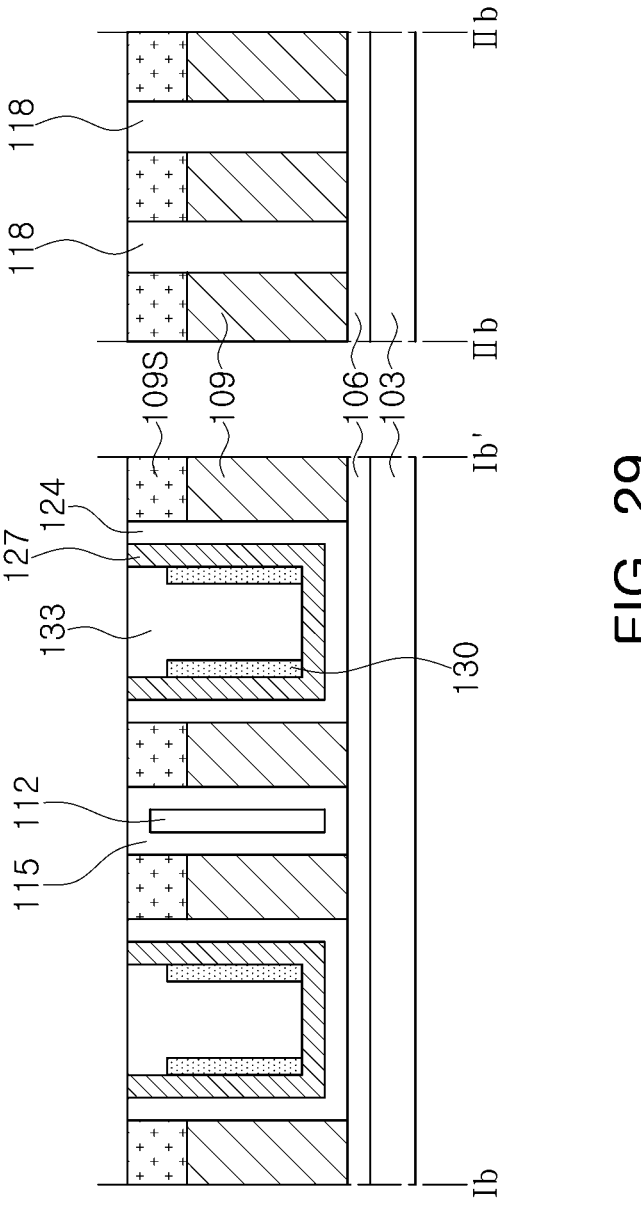

Referring to FIGS. 8 and 29, an insulating layer 133 filling the openings 121 may be formed on a structure formed up to the intermediate conductive lines 130, and a planarization process may be performed until the upper surfaces of the semiconductor patterns 109 are exposed. The insulating layer 133 may be referred to as a first intermediate insulating layer 133.

First source/drain regions 109S may be formed in the semiconductor patterns 109. The first source/drain regions 109S may be formed in upper regions of the semiconductor patterns 109.

Figure 30:
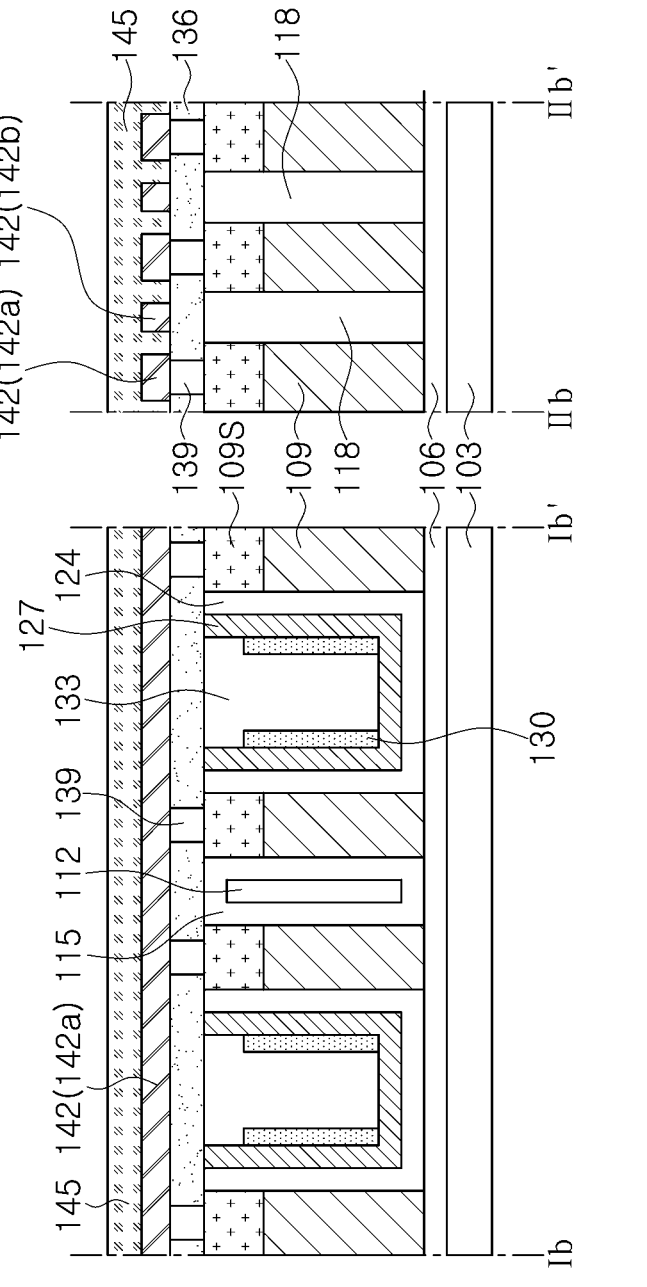

Referring to FIGS. 8 and 30, a lower interlayer insulating layer 136 may be formed. Lower contact plugs 139 passing through the lower interlayer insulating layer 136, the lower contact plugs 139 in contact with the first source/drain regions 109S and lower conductive lines 142 on the lower interlayer insulating layer 136 may be formed. The lower conductive lines 142 may include first lower conductive lines 142a electrically connected to the first source/drain regions 109S through the lower contact plugs 139, and second lower conductive lines 142b disposed between the first lower conductive lines 142a and electrically isolated from the first source/drain regions 109S. A lower capping layer 145 may be formed on the lower conductive lines 142.

Figure 31:
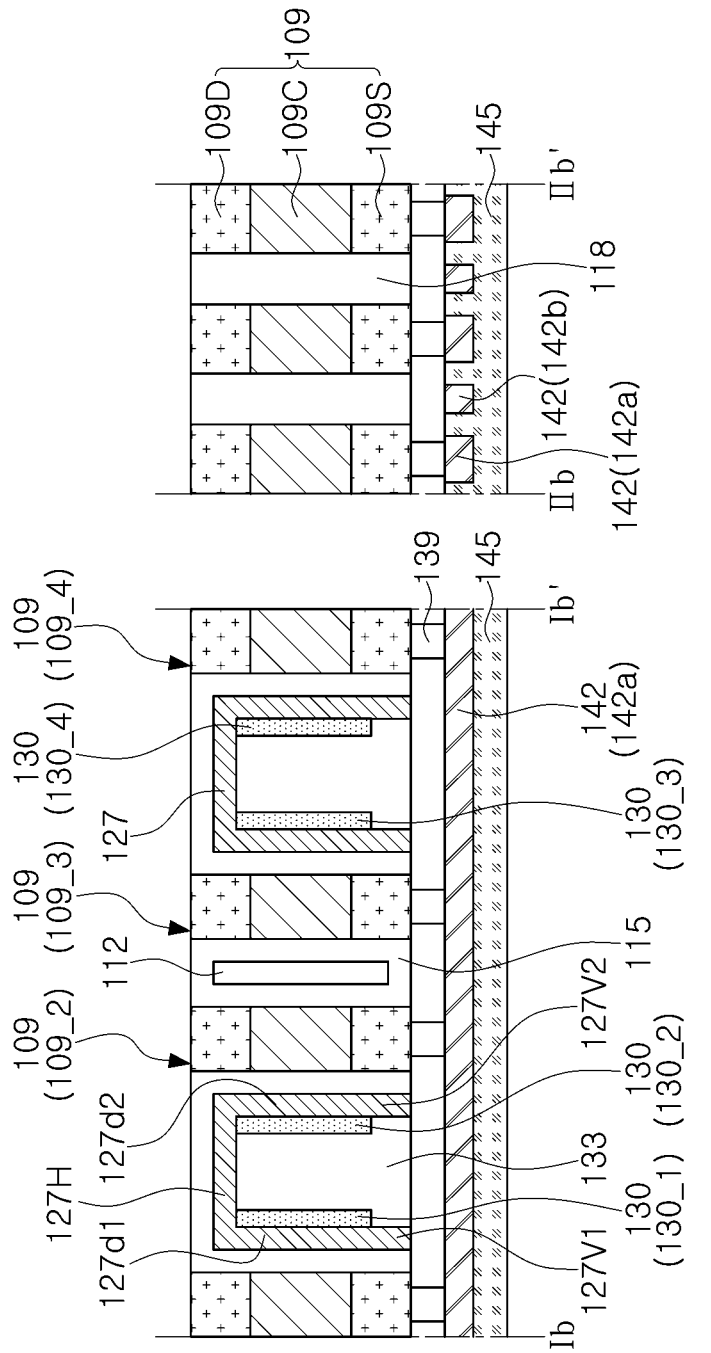

Referring to FIGS. 8 and 31, the lower substrate 103 and the insulating layer 106 may be sequentially removed. Accordingly, as the insulating layer 106 is removed, surfaces of the semiconductor patterns 109 may be exposed.

The surfaces of the semiconductor patterns 9 exposed by the removed insulating layer 6 may be referred to as upper surfaces of the semiconductor patterns 9. The first source/drain regions 109S may be formed in lower regions of the semiconductor patterns 109. Second source/drain regions 109D may be formed in upper regions of the semiconductor patterns 109. Accordingly, each of the semiconductor patterns 109 may include the first source/drain region 109S, the second source/drain region 109D, and a channel region 109C between the first and second source/drain regions 109S and 109D.

Referring back to FIGS. 8 and 9, an upper interlayer insulating layer 149 covering the second source/drain regions 109D may be formed. Upper contact plugs 151 passing through the upper interlayer insulating layer 149, the upper contact plugs 151 in contact with the second source/ drain regions 109D and upper conductive lines 154 on the upper interlayer insulating layer 149 may be formed. The upper conductive lines 154 may include first upper conductive lines 154a electrically connected to the second source/drain regions 109D through the upper contact plugs 151, and second upper conductive lines 154b disposed between the first upper conductive lines 154a and electrically isolated from the second source/drain regions 109D. An upper capping layer 157 may be formed on the upper conductive lines 154.

According to example embodiments, a data storage layer may be disposed between a gate line and a vertical channel without a capacitor for storing data, and thus a semiconductor device may have a high degree of integration.

According to example embodiments, a semiconductor device may include a vertical channel region between a lower conductive line and an upper conductive line, a gate line facing the vertical channel region, and a data storage layer between the gate line and the vertical channel region. The vertical channel region may be formed of a single crystal semiconductor, and thus the semiconductor device may have improved charge mobility and on-current properties.

According to example embodiments, shielding lines capable of screening capacitive coupling may be disposed between conductive lines, and thus a semiconductor device may have improved electrical performance.

According to example embodiments, a data storage layer may include a ferroelectric layer capable of storing data, and thus, a semiconductor device of a ferroelectric memory (FeRAM) may have a high degree of integration and improved electrical performance.

While aspects of example embodiments have been shown and described above, it will be apparent to those skilled in the art that modifications and variations could be made without departing from the scope of the appended claims.

What is claimed is:
1. A semiconductor device comprising:
first lower conductive lines extending in a first direction and disposed at a first height level;
first upper conductive lines extending in the first direction and vertically overlapping the first lower conductive lines at a second height level, higher than the first height level;
second upper conductive lines alternately and repeatedly arranged with the first upper conductive lines in a second direction intersecting the first direction, at the second height level;
single crystal semiconductor patterns disposed between the first lower conductive lines and the first upper conductive lines;
intermediate conductive lines extending in the second direction and passing between the single crystal semiconductor patterns, between the first height level and the second height level; and
data storage layers comprising portions between the intermediate conductive lines and the single crystal semiconductor patterns,
wherein the first upper conductive lines are electrically connected to the single crystal semiconductor patterns, and
wherein the second upper conductive lines are electrically isolated from the single crystal semiconductor patterns.
2. The semiconductor device of claim 1, further comprising insulating layers between the data storage layers and the single crystal semiconductor patterns, wherein each of the data storage layers comprises a ferroelectric material.
3. The semiconductor device of claim 1, wherein each of the single crystal semiconductor patterns comprises a lower source/drain region, an upper source/drain region, and a vertical channel region between the lower source/drain region and the upper source/drain region,
wherein the lower source/drain region of one of the single crystal semiconductor patterns is electrically connected to one of the first lower conductive lines, and
wherein the upper source/drain region of one of the single crystal semiconductor patterns is electrically connected to one of the first upper conductive lines.
4. The semiconductor device of claim 3, further comprising:
lower contact plugs electrically connecting the lower source/drain region of each of the single crystal semiconductor patterns and the first lower conductive lines to each other, between the lower source/drain region of each of the single crystal semiconductor patterns and the first lower conductive lines; and
upper contact plugs electrically connecting the upper source/drain region of each of the single crystal semiconductor patterns and the first upper conductive lines to each other, between the upper source/drain region of each of the single crystal semiconductor patterns and the first upper conductive lines.
5. The semiconductor device of claim 1,
wherein each of the single crystal semiconductor patterns comprises a lower source/drain region, an upper source/drain region, and a vertical channel region between the lower source/drain region and the upper source/drain region,
wherein the first upper conductive lines are electrically connected to the upper source/drain region of each of the single crystal semiconductor patterns, and
wherein the second upper conductive lines are electrically isolated from the upper source/drain region of each of the single crystal semiconductor patterns.
6. The semiconductor device of claim 1, further comprising second lower conductive lines alternately and repeatedly arranged with the first lower conductive lines in the second direction, at the first height level,
wherein each of the single crystal semiconductor patterns comprises a lower source/drain region, an upper source/drain region, and a vertical channel region between the lower source/drain region and the upper source/drain region,
wherein the first lower conductive lines are electrically connected to the lower source/drain region of each of the single crystal semiconductor patterns, and
wherein the second lower conductive lines are electrically isolated from the lower source/drain region of each of the single crystal semiconductor patterns.
7. The semiconductor device of claim 1, further comprising:
a lower bonding pad disposed at a level higher than the first upper conductive lines;
a lower bonding insulating layer disposed at a level higher than the first upper conductive lines, the lower bonding insulating layer having an upper surface coplanar with an upper surface of the lower bonding pad; and
an upper chip structure disposed on the lower bonding pad and the lower bonding insulating layer,
wherein the upper chip structure comprises:
a peripheral circuit structure;

an upper bonding insulating layer disposed below the peripheral circuit structure in contact with the lower bonding insulating layer; and an upper bonding pad disposed below the peripheral circuit structure in contact with the lower bonding pad.

8. The semiconductor device of claim 1, wherein the single crystal semiconductor patterns comprise single crystal silicon carbide.

9. The semiconductor device of claim 1, further comprising second lower conductive lines alternately and repeatedly arranged with the first lower conductive lines in the second direction, at the first height level, wherein the first lower conductive lines are electrically connected to the single crystal semiconductor patterns, and wherein the second lower conductive lines are electrically isolated from the single crystal semiconductor patterns.

10. A semiconductor device comprising:

first lower conductive lines extending in a first direction and disposed at a first height level;

first upper conductive lines extending in the first direction and vertically overlapping the first lower conductive lines at a second height level, higher than the first height level;

single crystal semiconductor patterns disposed between the first lower conductive lines and the first upper conductive lines;

intermediate conductive lines extending in a second direction intersecting the first direction and passing between the single crystal semiconductor patterns, between the first height level and the second height level; and data storage layers comprising portions between the intermediate conductive lines and the single crystal semiconductor patterns, wherein the single crystal semiconductor patterns comprise a first single crystal semiconductor pattern and a second single crystal semiconductor pattern adjacent to each other in the first direction, wherein the intermediate conductive lines comprise gate lines and intermediate shielding lines alternately and repeatedly arranged in the first direction, wherein the intermediate conductive lines comprise a first intermediate conductive line and a second intermediate conductive line passing between the first single crystal semiconductor pattern and the second single crystal semiconductor pattern, the first intermediate conductive line and the second intermediate conductive line being parallel to each other, wherein the first intermediate conductive line is one of the gate lines, and wherein the second intermediate conductive line is one of the intermediate shielding lines.

11. A semiconductor device comprising:

first lower conductive lines extending in a first direction and disposed at a first height level;

first upper conductive lines extending in the first direction and vertically overlapping the first lower conductive lines at a second height level, higher than the first height level;

single crystal semiconductor patterns disposed between the first lower conductive lines and the first upper conductive lines;

intermediate conductive lines extending in a second direction intersecting the first direction and passing between the single crystal semiconductor patterns, between the first height level and the second height level; and data storage layers comprising portions between the intermediate conductive lines and the single crystal semiconductor patterns, wherein the single crystal semiconductor patterns comprise a first single crystal semiconductor pattern, a second single crystal semiconductor pattern, a third single crystal semiconductor pattern, and a fourth single crystal semiconductor pattern sequentially arranged in the first direction, wherein the intermediate conductive lines comprise first and second intermediate conductive lines passing between the first and second single crystal semiconductor patterns, and third and fourth intermediate conductive lines passing between the third and fourth single crystal semiconductor patterns, and wherein the intermediate conductive lines are not disposed between the second and third single crystal semiconductor patterns.

12. The semiconductor device of claim 11, further comprising an air gap between the second and third single crystal semiconductor patterns.

13. The semiconductor device of claim 11, further comprising a conductive intermediate shielding line passing between the second and third single crystal semiconductor patterns and extending in the second direction.

* * * * *